(12) United States Patent
Kondo et al.

(10) Patent No.: US 6,507,641 B1
(45) Date of Patent: Jan. 14, 2003

(54) X-RAY-GENERATION DEVICES, X-RAY MICROLITHOGRAPHY APPARATUS COMPRISING SAME, AND MICROELECTRONIC-DEVICE FABRICATION METHODS UTILIZING SAME

(75) Inventors: Hiroyuki Kondo, Kawasaki (JP); Katsuhiko Murakami, Kawasaki (JP); Masayuki Shiraishi, Tokyo (JP); Katsumi Sugisaki, Tokyo (JP)

(73) Assignee: Nikon Corporation, Tokyo (JP)

( * ) Notice: Subject to any disclaimer, the term of this patent is extended or adjusted under 35 U.S.C. 154(b) by 138 days.

(21) Appl. No.: 09/684,872

(22) Filed: Oct. 6, 2000

(30) Foreign Application Priority Data

Oct. 8, 1999 (JP) .......................................... 11-287567

(51) Int. Cl.[7] .............................................. H01I 37/00
(52) U.S. Cl. ....................................... 378/119; 378/121
(58) Field of Search .................................. 378/119, 121

(56) References Cited

U.S. PATENT DOCUMENTS

| 4,752,946 | A | * | 6/1988 | Gupta et al. ................. 378/119 |
| 5,763,930 | A | * | 6/1998 | Partlo ....................... 250/493.1 |
| 5,991,360 | A | * | 11/1999 | Matsui et al. ............... 378/119 |
| 6,054,841 | A | | 4/2000 | Sudo et al. |
| 6,064,072 | A | | 5/2000 | Partlo et al. |

OTHER PUBLICATIONS

Partlo et al., "EUV (13.5nm) Light Generation Using a Dense Plasma Focus Device," SPIE 3676:846–858 (1999).
Rymell et al., "Droplet for low–debris laser–plasma soft X–ray generation," Optics Communications 103:105–110 (1993).
Partlo et al., "EVU (13.5nm) Light Generation Using a Dense Plasma Focus Device," presented at the SPIE 24th Annual International Symposium on Microlithography, 1999.

* cited by examiner

Primary Examiner—Robert H. Kim
Assistant Examiner—Hoon K. Song
(74) Attorney, Agent, or Firm—Klarquist Sparkman LLP

(57) ABSTRACT

X-ray-generation devices are disclosed that generate X-rays in a stable manner over extended periods of time. An exemplary device includes an anode electrode and a cathode electrode coaxially arranged, and an insulating member. A nozzle connected to a reservoir of fluid target material directs a flow of fluid target material to the anode electrode. Meanwhile, a pulsed high voltage is applied between the anode electrode and cathode electrode in coordination with the supply of target material. The pulses are timed such that, whenever a unit of target material reaches a tip of the anode electrode, a plasma sheath generated at the surface of the insulating member also reaches the tip of the anode electrode. Hence, the target material is supplied automatically as required to produce X-rays continuously over an extended time period. Intense X-ray fluxes can be produced in a stable manner by monitoring the rate at which target material is supplied to the plasma, relative to the timing of discharge pulses.

45 Claims, 9 Drawing Sheets

X-RAY-GENERATION DEVICES, X-RAY MICROLITHOGRAPHY APPARATUS COMPRISING SAME, AND MICROELECTRONIC-DEVICE FABRICATION METHODS UTILIZING SAME

FIELD OF THE INVENTION

The present invention pertains to microlithography (projection-transfer of a pattern, defined on a reticle, onto a suitable substrate) and related technologies. Microlithography is a key technology used in the manufacture of microelectronic devices such as integrated circuits, displays, and the like. More specifically, the invention pertains to apparatus and methods (such as microlithography apparatus and methods) performed using an X-ray beam as an energy beam. Even more specifically, the invention pertains to X-ray sources that generate a beam of "soft" X-ray radiation for use in an X-ray microlithography apparatus, an X-ray microscope, an X-ray analysis device, or the like, and to microelectronic-device manufacturing methods utilizing such X-ray exposure technology.

BACKGROUND OF THE INVENTION

X-ray sources that utilize a discharge plasma are small, produce a large X-ray flux, convert input electrical energy into X-rays at a higher efficiency than X-ray sources that utilize a laser-generated plasma, and are inexpensive. Hence, there has been substantial activity directed to the development of X-ray microscopes and X-ray microlithography apparatus that include a discharge-plasma X-ray source.

An exemplary discharge-plasma X-ray source is termed a "Dense Plasma Focus" (DPF) source manufactured by Cymer, Inc., San Diego, Calif. Information concerning this source is available on the Internet home page of Cymer, Inc. (http://www.cymer.com/) in the paper by Partlo et al., "EUV (13.5 nm) Light Generation Using a Dense Plasma Focus Device," presented at the SPIE 24th Annual International Symposium on Microlithography, 1999, incorporated herein by reference. See also, U.S. Pat. No. 5,763,930, incorporated herein by reference.

A schematic diagram of a DPF source is shown in FIG. 10. The DPF is enclosed in a vacuum chamber (not shown). An electric charge from a DC high-voltage power supply 700 is stored in a capacitor $C_0$. After the capacitor $C_0$ reaches full charge, the charge is transferred to a capacitor $C_1$ by closing a switch 701 (comprising a thyristor, IGBT (Insulated Gate Bipolar Transistor), or the like). Charging of the capacitor $C_1$ raises the voltage of the capacitor $C_1$, and the voltage is applied between a concentrically arranged (coaxial) anode electrode 703 and cathode electrode 702. As the applied voltage nears a peak voltage, a hollow-cathode preionization source (not shown) initiates avalanche breakdown of molecules of a gas situated between the anode electrode 703 and cathode electrode 702. This causes an electrical discharge to begin between the electrodes 702, 703.

At the onset of discharge, the electrical current flowing from the capacitor $C_1$ is momentarily held off by a saturable reactor SR until a uniform plasma sheath has formed at the base of the set of electrodes 702, 703. That is, at the surface of an insulator 704 disposed between the anode 703 and cathode 702, a uniform plasma sheath is generated by a surface discharge occurring at the insulator 704. As the capacitor $C_1$ continues to dump electrical current across the electrodes 702, 703, the plasma sheath moves toward the tip of the anode electrode 703. The resulting magnetic forces generated at the tip of the anode electrode 703 compress the plasma in this region toward the axis. Also, as the plasma reaches the tip of the anode electrode 703, materials situated at the anode tip (e.g., gas molecules, the electrode material, or a target material) are energized sufficiently to enter the plasma. The plasma, compressed within the small region bounded by the strong magnetic field, undergoes further heating, causing soft X-ray (SXR) radiation to propagate therefrom. (SXR radiation also is termed herein "extreme ultraviolet" or "EUV" radiation.)

The saturable reactor SR undergoes charge saturation as the plasma sheath moves between the electrodes 702, 703, or at least when the plasma sheath reaches the tip of the anode electrode 703. Saturation causes a large current to flow between the anode 703 and the cathode 702, resulting in further heating and compression of the plasma at the tip of the anode electrode 703.

In the X-ray source summarized above, the target material conventionally is a gas present in an atmosphere in the vicinity of the electrodes 702, 703. The target material also can be the material constituting the anode electrode, or a substance on the surface of the anode electrode.

With conventional technology, problems arise whenever a gas (present in the atmosphere in the vicinity of the electrodes) is used as the target material. Because SXR radiation usually is highly absorbed by matter, the pressure of the gas generally cannot be increased. At the same time, the pressure of the gas inside the vacuum chamber generally needs to be about 10 Torr or lower. (Whenever a gas is used as the target material, the gas pressure normally is kept low to reduce the density of the target material.) Unfortunately, with such a scheme, the intensity of the generated SXR radiation also is very weak. For example, the publications noted above describe experiments performed using 0.1 -Torr Xe and 0.2-Torr Ar as target-material gases. However, almost no difference is observed in the SXR spectra generated from these target materials because substantial SXR radiation also is generated by the electrode material (e.g., tungsten). Hence, a gas is not optimal for use as a target material.

Whenever a solid electrode is used to supply the target material, the electrode tends to melt and be eroded away by the large electrical current applied to the electrode from the discharge. This results in rapid substantial changes of electrode shape, rendering long-term stable operation impossible. A melted or eroded electrode requires frequent interruption in use to perform electrode replacement, resulting in decreased operating efficiency. In addition, as the electrode is melted or eroded, material released from the electrode tends to migrate to and deposit on neighboring optical components and other structures. Deposits of such materials tend to reduce the optical performance (e.g., reflectivity or transmittance) of the affected optical components.

If the target material is situated on the anode electrode 703, then a distinctive spectrum of SXR radiation (i.e., a spectrum distinctive of the target material) can be generated. However, the target material conventionally must be applied to the electrode (and periodically replenished) by a discrete operation including shut-down of the apparatus, which renders continuous long-term operation impossible. An exemplary target material, as discussed in the Partlo et al. reference cited above, is lithium (Li); another exemplary target material, as discussed in the JP '195 patent document cited above is lithium hydroxide (LiH). Unfortunately, both substances are highly reactive and dangerous, and are difficult to handle. Also, both of these substances react violently with water. Whenever atmospheric air is introduced into the vacuum chamber containing these target materials, a substantial risk is created of residual Li or LiH in the vacuum chamber reacting explosively with water vapor in the air.

The shortcomings of conventional X-ray-generation devices as summarized above extend also to X-ray microlithographic apparatus that comprise such X-ray-generation devices as a source of SXR radiation used for pattern transfer. i.e., the apparatus frequently must be shut down temporarily for electrode servicing. As a result, microelectronic-device fabrication using such apparatus tends to exhibit disappointingly low throughput.

SUMMARY OF THE INVENTION

In view of the shortcomings of the prior art as summarized above, an object of the invention is to provide X-ray-generation devices that can generate SXR radiation in a manner characterized by long-term stability both when using an electrode as the target material and when using a substance other than the electrode as the target material. Another object is to provide X-ray-generation devices that cause less reduction in optical performance, of an X-ray optical system used in conjunction with the X-ray-generation device, when the electrode or components peripheral to the electrode are eroded by high current or plasma. Yet another object is to provide X-ray-generation devices that are less dangerous to handle than conventional devices. Yet another object is to provide X-ray microlithography apparatus including such devices and microelectronic-device fabrication methods that, by utilizing such apparatus, exhibit improved throughput compared to conventional apparatus.

To such ends, and according to a first aspect of the invention, X-ray-generation devices are provided. An embodiment of such a device comprises first and second electrodes configured and situated relative to each other such that a voltage pulse applied across the electrodes forms a first plasma between the electrodes and concentrates the first plasma at a location relative to the first electrode. The "location" includes a target material that is energized by the concentrated first plasma sufficiently to be consumed and to cause a second (and concentrated) plasma of the target material to emit soft X-ray (SXR) radiation having a spectral profile characteristic of the target material. The device also includes means for supplying, during operation of the X-ray-generation device, the target material to the location as the target material is consumed by the concentrated plasma. The means for supplying the target material can be configured to provide the target material "continuously" or "intermittently" (defined below) as the target material is consumed.

Any of various target materials can be used, which can be in a gaseous, liquid, or in a solidified state. For example, if the target material is a gas, then the means for supplying the target material can comprise a gas vessel and a valve, wherein the valve is situated and configured to release gas controllably from the gas vessel to the location. More specifically, the first electrode can be hollow and having a first end connected to the valve, a second end opening at the location, and a lumen connecting the first and second ends. In such a configuration, the valve can be situated and configured to release gas controllably from the gas vessel through the lumen and the second end of the hollow electrode to the location. This configuration also can include a means for recovering unconsumed target-material gas for subsequent recycling to the means for supplying the target material.

If the target material is a liquid, then the means for supplying the target material can comprise a reservoir and a nozzle, wherein the nozzle is situated and configured to discharge the target material from the reservoir to the location in a controllable manner. More specifically, the nozzle can be configured to discharge the target material as a continuous liquid stream or as discrete droplets to the location. This configuration also can include means for recovering unconsumed target material for subsequent recycling to the means for supplying the target material. For example, the first electrode can have a hollow configuration having a first end opening at the location, a second end, and a lumen connecting the first and second ends. In such a configuration, the means for supplying the target material can be configured to direct the target material to the first end such that unconsumed target material enters the first end and passes through the lumen to the second end. The means for recovering unconsumed target material can comprise a trap situated and configured to collect unconsumed target material exiting the second end. The means for recovering unconsumed target material also can include a means for recycling collected unconsumed target material from the trap to the reservoir.

If the target material is a solidified material, then the means for supplying the target material can comprise a reservoir and a nozzle, wherein the nozzle is situated and configured to discharge particles of the target material controllably from the reservoir to the location. More specifically, the first electrode can have a hollow configuration having a first end opening at the location, a second end, and a lumen connecting the first and second ends. In such a configuration, the means for supplying the target material can be configured to direct the target material to the first end such that unconsumed target material enters the first end and passes through the lumen to the second end. The means for recovering unconsumed target material can comprise a trap situated and configured to collect unconsumed target material exiting the second end. The means for recovering unconsumed target material also can include a means for recycling collected unconsumed target material from the trap to the reservoir.

The first electrode in the X-ray-generation device can be made at least partially of the target material that is consumed in the concentrated plasma at the location, that otherwise subjects the first electrode to erosion. In such a configuration, the means for supplying the target material can comprise a mechanism situated and configured to replenish the first electrode during erosion of the first electrode. The mechanism also can include a linear actuator attached to the first electrode, wherein the linear actuator is configured to move the first electrode in a manner serving to compensate for erosion of the first electrode.

The first electrode can be made of the solid target material, wherein the first electrode has a proximal end located adjacent the location, and a distal end. In such a configuration, the mechanism can comprise an extruder having an output connected to the distal end. The extruder can be configured to extrude an additional length of the first electrode to compensate for erosion of the first electrode. The extruder can include a furnace that provides a source of liquid target material. In such a configuration, the extruder includes an extrusion die and a means for urging the liquid target material through the extrusion die. The extruded liquid solidifies at the distal end in a manner serving to increase a length of the first electrode sufficiently to restore the proximal end adjacent the location.

The X-ray-generation device also can include a first-electrode monitor situated and configured to detect a position of the first electrode during use. Hence, a need for replenishing the first electrode is detected. Such detection can be used to direct the mechanism to replenish the first electrode as required to compensate for erosion of the first electrode.

According to another embodiment, an X-ray-generation device according to the invention comprises first and second electrodes configured and situated relative to each other such that a voltage pulse applied across the electrodes forms a plasma between the electrodes. The plasma is concentrated at a location adjacent the first electrode (e.g., anode electrode). The device also includes a means for providing a target material at the location so as to cause the concentrated plasma to produce soft-X-ray radiation having a spectral profile characteristic of the target material. The device also includes a means for replenishing, during operation of the X-ray-generation device, the first electrode (e.g., anode electrode) as it is eroded during operation of the X-ray-generation device.

Replenishment of the first electrode can be either "continuous" or "intermittent." Either way, if the electrode were to be eroded by the plasma, an equivalent amount of the electrode material would be replenished without having to interrupt operation of the device. As used herein, "continuous" replenishment means replenishment without interruption over a period of time, and "intermittent" replenishment means replenishment with interruptions over a period of time. Neither necessarily means continuous replenishment over an infinitely long period of time.

The apparatus can include a means for controllably maintaining the tip of the first electrode at a substantially constant position (relative to the location) as the tip is eroded during operation of the X-ray-generation device. In this embodiment, for example, the position of the tip of an electrode subject to erosion is detected by a detector. Data from the detector can be used to control an electrode-replenishment device to maintain the tip at a "substantially constant" position. Such control of the tip position allows the plasma-generation position and plasma-generation parameters to held substantially constant, thereby providing an X-ray source exhibiting stable characteristics over a long period of time. As used in this context, "substantially constant" means that some amount of deviation is allowed within respective ranges for the plasma-generation position and plasma-generation parameters. Whenever these parameters are within the specified respective ranges, no corrective action need be taken. Whenever these parameters exceed the respective ranges, corrective action is initiated to return to within range.

According to another embodiment, an X-ray-generation device according to the invention comprises first and second electrodes configured and situated relative to each other such that a voltage pulse applied across the electrodes forms a plasma between the electrodes. The plasma is concentrated at a location adjacent the first (e.g., anode) electrode. The device includes a means for providing a target material at the location so as to cause the concentrated plasma to produce soft-X-ray radiation having a spectral profile characteristic of the target material. The device also includes means for "continuously" or "intermittently" (see above) supplying the target material during operation of the X-ray-generation device.

Generally, in this embodiment, the target material is a liquid or solid. If the target material is supplied continuously, operation of the X-ray-generation device can be continuous over a long period of time. However, plasma generation typically is pulsatile, so it is not necessary to supply target material continuously; intermittent supply is sufficient. Hence, even an "intermittent" supply of target material allows continuous operation of the device over a long period of time. As described elsewhere herein, liquid or solid target materials can be suspended in a carrier gas. The carrier gas itself can be a target material.

The device also can include a trigger mechanism connected to the electrodes and configured to control a timing with which the voltage pulses are applied to the electrodes. Hence, a plasma is produced at the location or a plasma previously generated between the electrodes arrives at the location synchronously with provision of the target material at the location or with a moment in which a density of the target material at the location exceeds a predetermined threshold density. This embodiment is especially useful when the target material is supplied intermittently. Hence, the arrival of target material at the location or the target-material density at the location being at or above a specified density (in the case of a gas) is detected. Detection can be performed directly using a detector or indirectly. The timing of the high-voltage pulse applied between the electrodes is controlled so that plasma is generated at the proper time. Also, in cases in which the generated plasma moves and is focused at or near the "location", as in the DPF system, the timing can be controlled such that the plasma is present at the location at exactly the instant the target material reaches the location where the plasma sheath is highly confined (i.e., where the plasma is "focused"). Hence, the target material is converted into plasma under optimal conditions, thereby maximizing the intensity of the generated SXR radiation.

"Direct" detection of the arrival of target material, as noted above, is performed using a detector. "Indirect" detection is based on, e.g., an operational timing of valves intermittently controlling the supply of target material, or based on a detection that the density of target material at or near the location is at or above a specified density.

Each of various other embodiments of X-ray-generation devices according to the invention includes first and second electrodes as summarized above. One embodiment includes a target-material supply mechanism configured to introduce, during operation of the device, the target material as a supersonic gas stream at the location so as to cause the concentrated plasma to produce soft-X-ray radiation having a spectral profile characteristic of the target material. This embodiment is especially useful when the target material is a gas. Supplying such a target material as a supersonic gas stream provides adiabatic cooling of the target material. As a result, atoms of the target material are attracted to one another by van der Waals forces and thus become large cluster molecules. Formation of a plasma from cluster molecules increases the intensity of the generated X-rays. Also, cluster molecules discharged from a nozzle exhibit little divergence, thereby maintaining high density of target material at the location where the plasma sheath is focused, and maximizing the intensity of the generated X-rays.

In another embodiment, the target-material supply mechanism is configured to suspend particles of a target material in a carrier gas and to discharge the suspension at the location during operation of the device. This embodiment is especially useful when the target material is a solid or liquid. If the particle (or droplet) size is small, then the aggregate surface area is relatively large compared to when the particle (or droplet) size is large. Hence, small particle (or droplet) size allows a faster increase in temperature of the target material when introduced into the plasma, and thus produces a higher-temperature plasma. (Particle size need not be uniform.) Also, individual particles tend to form their own separate microplasmas, so drops in plasma temperature due to thermal conduction can be alleviated. These factors allow a high-temperature plasma (with accompanying high intensity of produced X-rays) to be maintained. Use of a carrier gas also allows units of target material that do not contribute to the plasma to be carried away in the gas stream. The carrier gas desirably has a high transmittance to the wavelength of the produced X-rays.

In another embodiment, the target-material supply mechanism is configured to deliver, during operation of the device, a focused stream of a target material at the location. The stream can be of discrete liquid droplets of target material, discrete particles of the target material, a continuous liquid stream of target material, or a continuous gaseous stream of target material. Here, "a focused stream at the location" means directing the stream of target material to the location such that the stream does not spread at any other location, and directing the stream from a relatively wide nozzle so that the target material collects at the location near the electrode tip. Near the electrode tip is where the plasma is generated and, in a DPF device, where the plasma sheath is focused. If the target material is directed to and focused at such a location, then substantially all the target material arriving at the location with the plasma sheath contributes to plasma generation, yielding a high intensity of SXR radiation.

In another embodiment, the target-material supply mechanism is configured to deliver, during operation of the device, a target material from at least one of the electrodes to the location. Hence, the electrode itself is used as a source of target material. As noted above, a plasma is generated in the location near the electrode tip. Hence, in this embodiment, the target material can be conveyed efficiently from the electrode into the plasma. Such a scheme increases plasma-formation efficiency and thus the intensity of produced X-rays. The effect is enhanced especially if the electrode that generates the plasma at the location or the electrode that focuses the generated plasma at the location is used as the supply of target material. Alternatively, target material can be supplied from another solid source near the location where plasma is generated, wherein the alternative source is not the electrode that generates the plasma or the electrode that focuses the generated plasma at the location.

In yet another embodiment, the target-material supply mechanism is configured to deliver, during operation of the device, lithium hydroxide to the location, wherein the lithium hydroxide is formulated as discrete solid particles, a suspension, a solution, or a gas. X-rays having a wavelength of 13.5 nm are generated whenever Li atoms are made into a plasma. Hence, for SXR microlithography, this embodiment is desirable. LiOH is preferred over Li or LiH due to the high reactivity of Li and LiH with water vapor. (LiOH has a much lower reactivity in this regard.) Also, LiOH can be used as a solid target material, as a liquid target material (dissolved in a solvent), or as a gaseous target material.

In yet another embodiment, the target-material supply mechanism is configured to deliver, during operation of the device, a target material to the location so as to cause the concentrated plasma to produce soft-X-ray radiation having a spectral profile characteristic of the target material. In this configuration, at least one of the electrodes, the insulating member, or other component exposed to the plasma is made of a material that is transmissive to the soft X-ray radiation. As electrodes and insulating materials are eroded in a plasma, debris from the erosion adheres to the surfaces of nearby optical components, which reduces the optical performance of those components. This embodiment avoids this problem by employing materials (as electrodes and/or insulators) that have a high transmittance to the X-ray wavelengths. Hence, if debris from such materials adheres to the surface of an optical member, the reduction in optical performance of the member is suppressed. This allows continuous use of the optical element over a longer period of time without replacement or human intervention. If the electrode and/or insulator includes a substance having a low X-ray transmittance, it should be possible to exhaust such debris readily. If the X-ray wavelength is 13.5 nm, then Si should be used for the insulator due to the high transmittance of this material. However, it is difficult to use Si alone as an insulator between electrodes. $SiO_2$ (a Si compound) can be used instead. $SiO_2$ made into a plasma breaks down to Si and oxygen. Oxygen does not have a high transmittance for 13.5-nm X-rays, but oxygen is gaseous and is exhausted readily without adhering to optical members.

According to another aspect of the invention, soft-X-ray (SXR) sources are provided. An embodiment of such a source includes a dense plasma focus (DPF) device configured to produce a plasma. The source also includes a target-material-supply mechanism configured to supply (continuously or intermittently), during operation of the dense plasma focus device, a target material to the plasma to cause the plasma to produce soft-X-ray radiation having a spectral profile characteristic of the target material. The SXR source can comprise multiple electrodes, wherein the target-material-supply mechanism includes a mechanism configured to replenish, during operation of the source, an electrode as the electrode is eroded during operation.

The foregoing and additional features and advantages of the invention will be more readily apparent from the following detailed description, which proceeds with reference to the accompanying drawings.

DETAILED DESCRIPTION

The invention is described below in the context of multiple representative embodiments. However, it will be understood that the embodiments are not intended to be limiting in any way.

First Representative Embodiment

Figure 1:
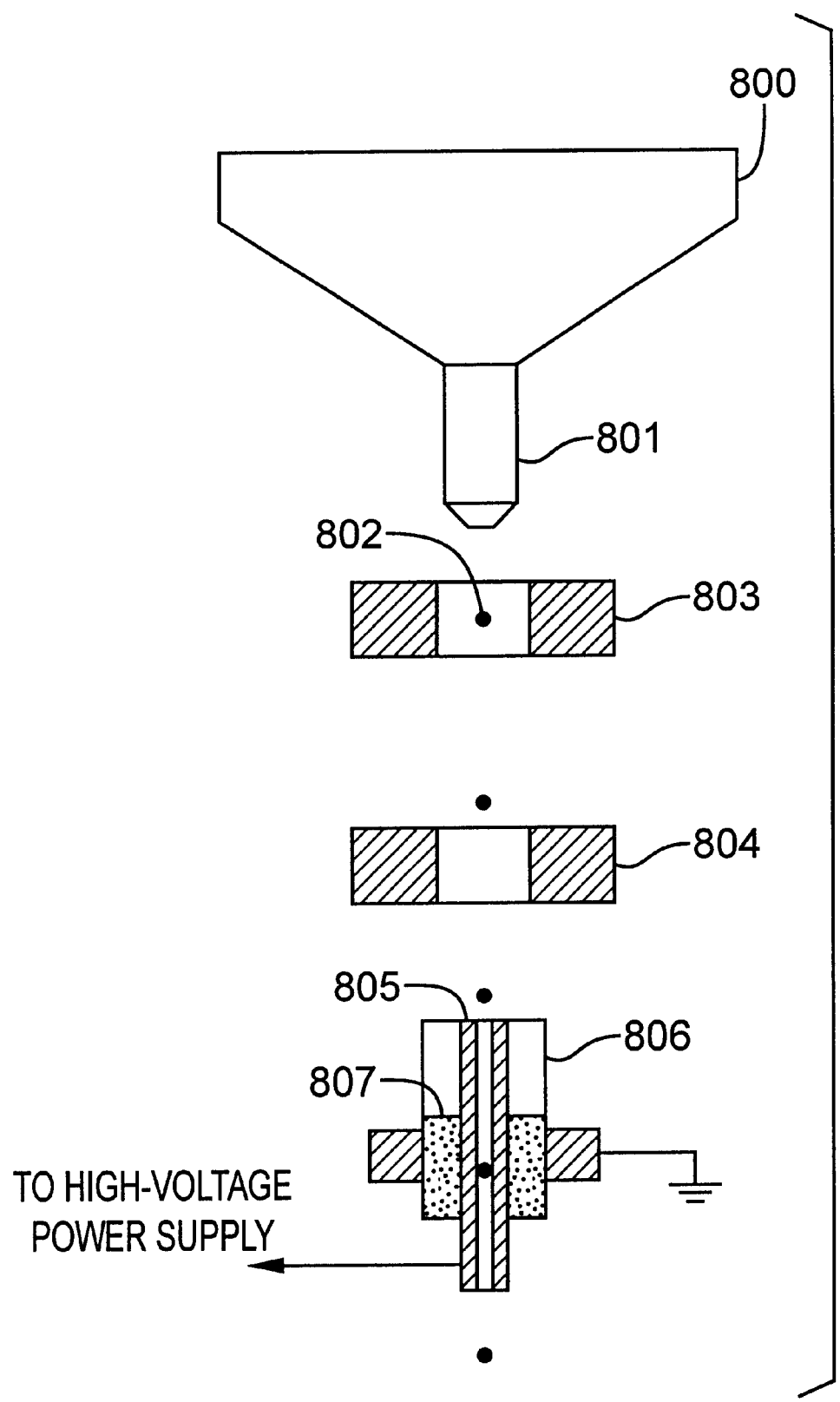
FIG. 1 is a schematic diagram of a first representative embodiment of an X-ray-generation device (X-ray source) according to the invention.

A first representative embodiment of a general configuration of an X-ray-generation device (X-ray source) according to the invention is shown schematically in FIG. 1. In FIG. 1 a Dense Plasma Focus (DPF) device is used as a discharge-plasma X-ray source. Also, in FIG. 1, the high-voltage power supply and vacuum chamber are not depicted for clarity.

In the FIG. 1 embodiment, a nozzle 801 is used for delivering target material to the DPF device. The nozzle 801 is connected to a target-material reservoir 800 normally situated above an anode electrode 805 (one of multiple coaxial electrodes) of the DPF device. A representative target material in this instance is particulate lithium hydroxide (LiOH), which is discharged from the nozzle 801. For example, FIG. 1 depicts a lithium hydroxide particle 802 directly above and descending toward the anode electrode 805. Two particle-position detectors 803, 804 detect respective moments in time during which the lithium hydroxide particle 802 descends through the detectors. From such information, the velocity of the particle 802 can be determined. Also, the moment at which the particle 802 reaches the upper end of the anode electrode 805 can be determined. A pulsed voltage is applied between the anode electrode 805 and a cathode electrode 806. The pulses are timed such that a plasma sheath generated at the surface of an insulating member 807 reaches the tip of the anode electrode 805 at the same moment the particle 802 reaches the upper end of the anode electrode 805. Particles 802 not used to form SXR radiation pass axially through the anode electrode 805.

With the FIG.-1 device, particles 802 of the target material are supplied automatically in an intermittent manner so that SXR radiation can be generated for a long period of time without having to interrupt operation of the X-ray source. Also, by monitoring the velocity of the particle 802 and by controlling the timing at which the particles are discharged from the nozzle 801, it is possible to obtain a strong and stable intensity of SXR radiation over a long period of operation.

In FIG. 1 discrete particles 802 are used as the target material. Alternatively, it is possible to use discrete groups of particles (e.g., aggregations of particles) instead of discrete single particles. By using particle groups and by correspondingly reducing the diameter of individual particles of a group, the temperature of the plasma and the resulting intensity of SXR radiation produced by the plasma can be increased correspondingly. For example, aggregates of particles of lithium hydroxide, tin (Sn), or tin oxide ($SnO_2$) can be used. Also, instead of solid particles, droplets of a liquid or a suspension of liquid and solid particles can be used as the target material.

Second Representative Embodiment

Figure 2:
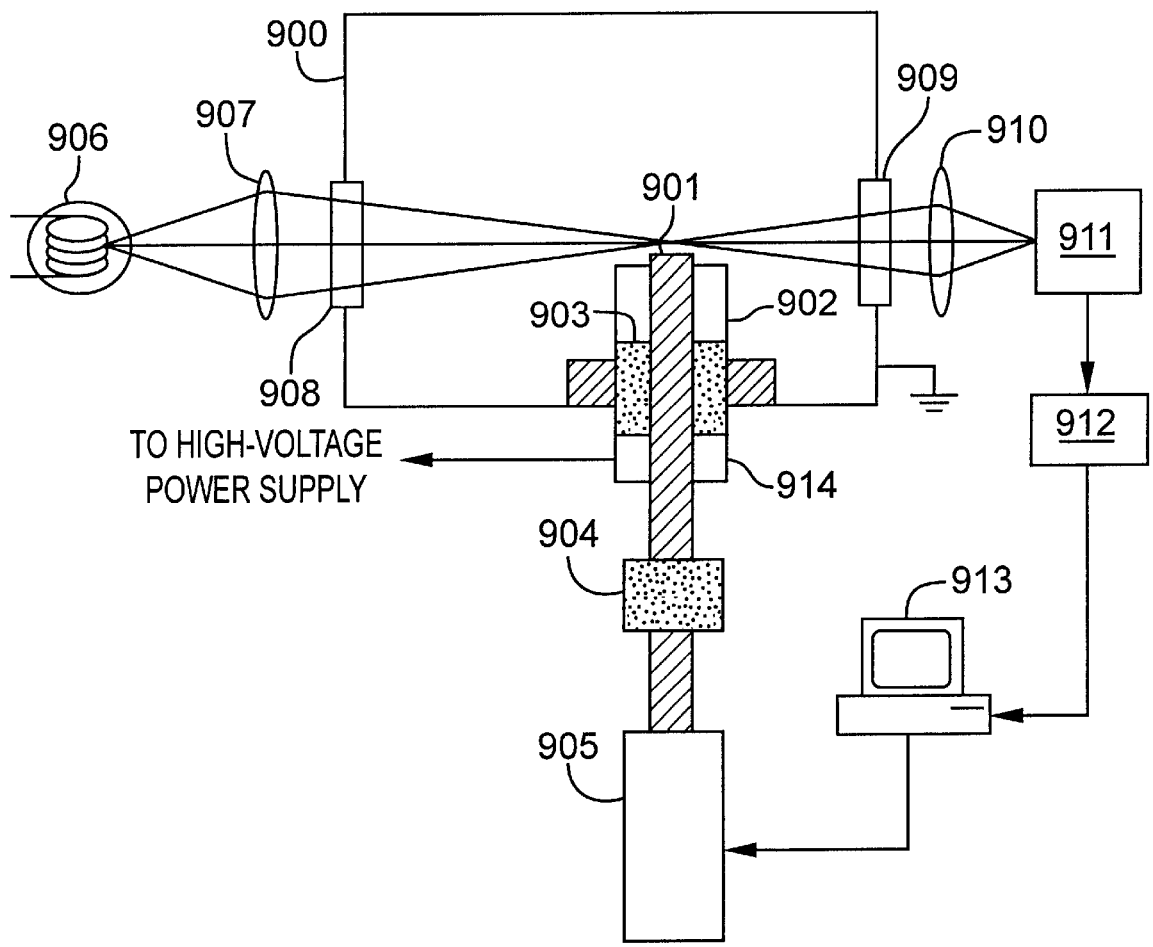
FIG. 2 is a schematic diagram of a second representative embodiment of an X-ray source according to the invention.

A second representative embodiment of a general configuration of an X-ray-generation device (X-ray source) according to the invention is shown schematically in FIG. 2. In FIG. 2 a Dense Plasma Focus (DPF) device is used as a discharge-plasma X-ray source. Also, in FIG. 2, the high-voltage power supply is not shown for clarity. An anode electrode 901 extends through an insulating member 903 and a contact 914. The anode electrode 901 is configured to contact an insulating member 904 mounted to a linear actuator 905. The linear actuator 905, when energized, causes movement of the insulating member 904 and hence the anode electrode 901. Thus, the anode electrode 901 can be extended further into the vacuum chamber 900 as required to compensate for erosion of the anode electrode 901. The contact 914 and anode electrode 901 are electrically conductive; the contact 914 is connected to a high-voltage power supply (not shown). A cathode electrode 902 is grounded to the vacuum chamber 900.

The tip position of the anode electrode 901 is monitored constantly or periodically by a CCD camera 911. To such end, light created by an illumination light source 906 passes through a lens 907 and a window 908 in the vacuum chamber to illuminate the anode electrode 901. The light passes through a window 909 and an objective lens 910 to the CCD camera 911. Hence, an image of the anode electrode 901, produced by the illumination light propagating from the anode electrode, is magnified and focused on the CCD camera 911 by the objective lens 910. The image received by the CCD camera 911 is recorded in a frame memory 912 and input to a computer 913 for processing.

An image of the anode electrode 901 before use of the X-ray source is routed to the computer 913. During actual use of the X-ray source, images of the anode electrode 901 are input to the computer 913 constantly or periodically, and compared by the computer 913 to the previously obtained image of the anode electrode 901 (stored in the memory 912). From such comparisons, if the tip position of the anode electrode 901 is outside an allowable position range, then the linear actuator 905 is driven to restore the tip of the anode electrode 901 to a position within specification.

Hence, as the tip of the anode electrode 901 is eroded away from use, additional length of the electrode 901 is supplied continuously or intermittently. As a result, it is unnecessary to stop operation of the X-ray source to replace an eroded (and hence shortened) electrode 901, and increased operating efficiency is achieved. Also, by maintaining the tip of the anode electrode 901 in a "nearly constant" position, stable discharge and hence stable X-ray intensity is obtained. Also, fluctuations in location at which X-ray-generation occurs also are reduced. As used herein, "nearly constant" means constant within an allowable amount of variation that still produces SXR radiation within an acceptable range of intensity for the particular use (e.g., SXR microlithography). So long as the SXR radiation is within the acceptable range, no adjustment is made to the anode electrode 901.

Third Representative Embodiment

Figure 3:
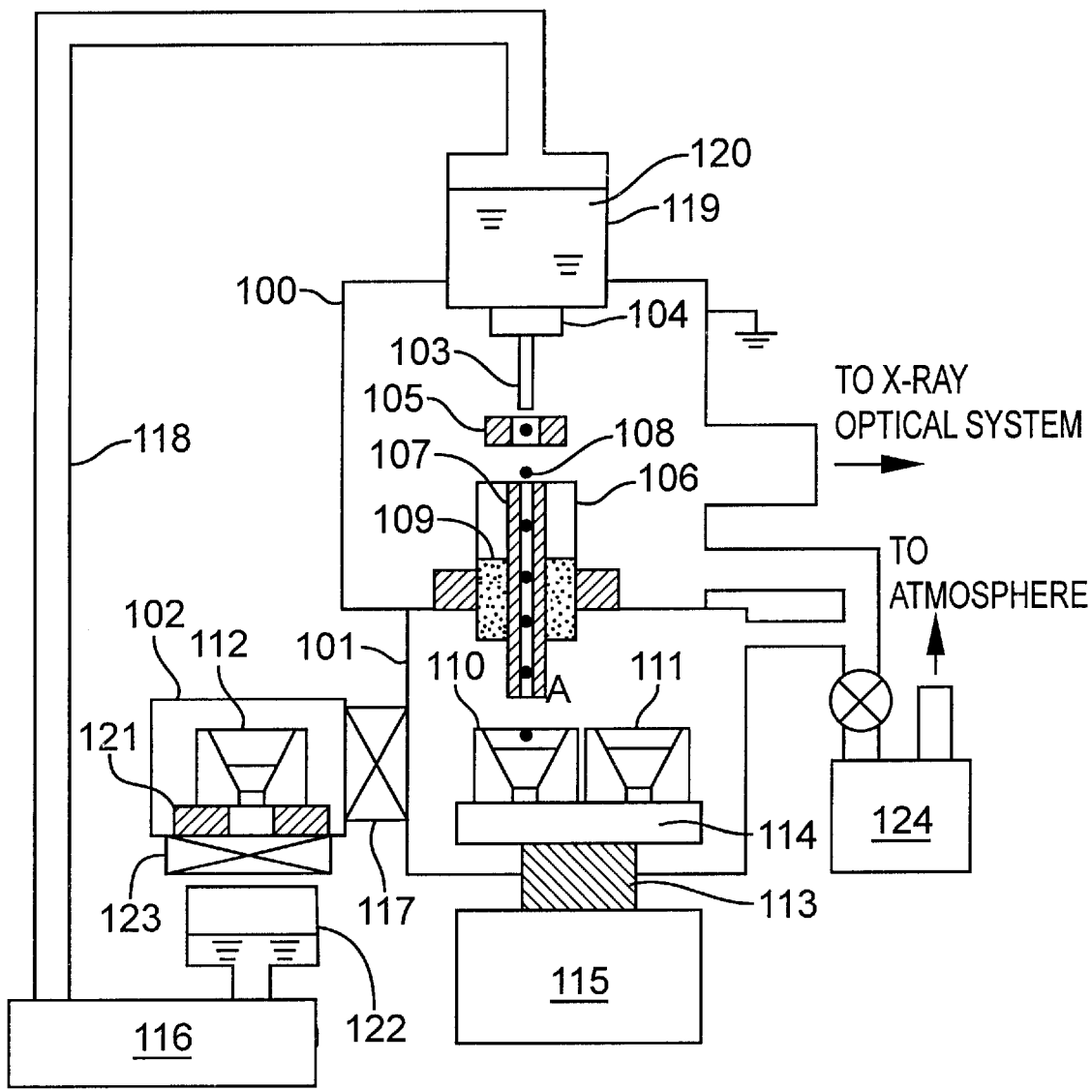
FIG. 3 is a schematic diagram of a third representative embodiment of an X-ray source according to the invention.

This embodiment is depicted schematically in FIG. 3. This embodiment uses a Dense Plasma Focus (DPF) device as a discharge-plasma X-ray source, as described in the First Representative Embodiment. That is, whenever high-voltage pulses are applied between an anode electrode 107 and a cathode electrode 106, a plasma sheath is generated, starting at the surface of an insulating member 109. The plasma rises between the electrodes 106, 107 and is focused at the tip of the anode electrode 107. (In FIG. 3, the high-voltage power supply for the DPF is not shown for clarity.)

The FIG.-3 apparatus includes a first vacuum chamber 100 and a second vacuum chamber 101. The pressure inside the vacuum chambers 100, 101 is reduced by a vacuum pump 124 to a desired subatmospheric pressure (e.g., about 10 Torr or lower) at which SXR radiation produced by the plasma is not absorbed or attenuated significantly.

In this embodiment a nozzle 103 (having an inside diameter of, e.g., about 10 $\mu$m) is used to supply the target material 108, which is discharged from the nozzle 103 inside the vacuum chamber 100. A piezoelectric transducer 104 contacts the base of the nozzle 103. The piezoelectric transducer 104 applies a vibration (frequency about 1 MHz) to the nozzle 103. The vibration atomizes the target material 108 as it passes through and is discharged from the nozzle 103.

In this embodiment an aqueous solution 120 of lithium hydroxide (LiOH) is used as the target material. A supply of the liquid solution 120 is contained in a reservoir 119. To deliver the solution 120 from the reservoir 119 to the nozzle 103, the atmosphere in the reservoir 119 above the solution 120 is pressurized by nitrogen gas supplied from a tank (not shown). An operating pressure of about 10 atmospheres in the reservoir 119 normally is sufficient to propel the aqueous solution 120 of lithium hydroxide through the nozzle 103.

In this embodiment the 13.5-nm line spectrum of SXR radiation created by lithium ions in the plasma is utilized by a downstream X-ray optical system (not shown). The nozzle 103 and the anode electrode 107 are situated relative to each other so that the liquid droplets 108 of target material discharged from the nozzle 103 descend directly toward the tip of the anode electrode 107. The cathode electrode 106, attached to the vacuum chamber 100, supports the anode electrode 107 via the insulating member 109.

Figure 10:
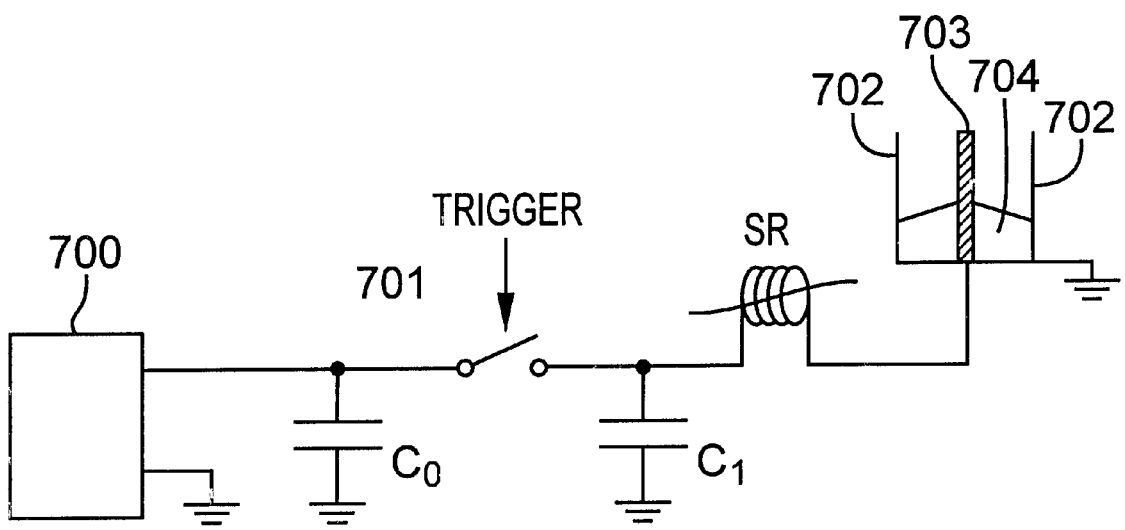
FIG. 10 schematically depicts certain general principles of operation of a conventional DPF-type discharge-plasma X-ray source.

A detector 105 generates a signal whenever a droplet 108 of the target material passes through the detector 105. The signal is input to a controller (not shown) understood to be a computer or the like connected to and configured to control and coordinate operation of the various components of this embodiment and perform signal processing as required. Based on the processed signal, the controller finely adjusts the vibration frequency of the piezoelectric transducer 104 and the trigger frequency and timing of the discharge switch of the discharge-plasma X-ray source (see FIG. 10). As a result, the plasma sheath reaches the tip of the anode electrode 107 at the instant the droplet 108 of target material also reaches the tip of the anode electrode 107.

The anode electrode 107 is tubular, and droplets 108 of the target material that do not contribute to the plasma axially descend through the inside diameter of the anode electrode 107 into a trap 110 (two traps 110, 111 are provided as discussed below). The traps 110, 111 are cooled by a cooling bath 115, into which liquid nitrogen is introduced via a cooling stage 114 and a thermally conductive body 113. Droplets 108 of the target material (lithium hydroxide solution) entering the trap 110 are cooled and solidified immediately. The vapor pressure of solidified lithium hydroxide is sufficiently low that the pressure inside the vacuum chamber 100 can be kept low for producing SXR radiation.

Two traps 110, 111 are provided in the vacuum chamber 101 and one trap 112 is provided in a preliminary chamber 102. Of the two traps in the vacuum chamber 101, one trap 110 is used to solidify and accumulate droplets of the target material and the other trap 111 simply is cooled for later use. Whenever the trap 110 is filled with solidified lithium hydroxide, the trap 110 is moved through a gate valve 117 to the preliminary chamber 102, and the trap 111 moved into position for capturing and freezing droplets 108 of the target material. Meanwhile, the trap 112 is conveyed to the previous position of the trap 111 to begin cooling.

Whenever a trap is moved to the preliminary chamber 102, the atmosphere inside the preliminary chamber 102 first is exhausted by a respective vacuum pump (not shown). As the interior of the preliminary chamber 102 reaches a desired preset vacuum level, the gate valve 117 opens and a full trap is moved into the preliminary chamber 102. Such an operational scheme avoids losing the vacuum established inside the vacuum chambers 100, 101. After the gate valve 117 closes, atmospheric pressure is restored inside the preliminary chamber 102. Another gate valve 123 opens, and the trap now inside the preliminary chamber 102 is heated by a heater 121. Heating the trap in this manner causes the solidified LiOH solution in the trap to melt. The liquid LiOH solution is drained from the trap into a container 122. A pump 116 withdraws the LiOH solution from the container 122 for return through a pipe 118 to the target reservoir 119 as required.

Target-material recovery and recirculation as described above provides a continuous supply of the target material and a more stable intensity of SXR radiation produced by the X-ray source. Also, as liquid droplets 108 of the target material pass by and through the anode electrode 107, the anode electrode is cooled.

Although the target material in this embodiment is described as an aqueous solution of lithium hydroxide, other target materials also can be used. Any liquid target material can be used that, when formed into a plasma, generates SXR radiation of the desired wavelength. As an alternative to a liquid, the target material can be a suspension of solid particles in a liquid. For example, lithium hydroxide particles may be suspended in liquid ethanol. The material serving as the "liquid" need not be liquid only at normal operating temperatures; the material can become a liquid when heated or cooled and thus liquefied as required by heating or cooling, respectively.

Also, creating liquid droplets is not limited to imparting vibrations to the nozzle 103; liquid droplets alternatively may be produced by any of various other means and methods.

The apparatus of FIG. 3 is configured such that the generated plasma moves upward from the insulating member 109 and is focused near the upper tip of the anode electrode 107. The droplets 108 of target material become part of the plasma as they reach the upper tip of the anode electrode 107. Alternatively, the anode electrode 107, cathode electrode 106, and insulating member 109 can be inverted vertically such that the end A in FIG. 3 extends upward. With such a configuration, a droplet of target material passing through the anode electrode 107 from the end A is made into a plasma as the droplet exits the anode electrode 107. It also is possible to configure the plasma-generating portion of the apparatus such that the nozzle 103 that forms the liquid droplets also constitutes the anode electrode.

In this embodiment, droplets that do not contribute to plasma generation are cooled and solidified. However, if the vapor pressure of liquid target material is lower than the pressure inside the vacuum chambers 100 and 101, then the target material can be collected and recirculated in the liquid state.

Also, in this embodiment, detection of droplets or particles (i.e., discrete units) of target material is performed by the detector 105, wherein the timing of target-material units reaching the tip of the anode electrode and of plasma focus at that location is synchronized. However, stabilization of the cycle with which units of target material are delivered removes the need for a target-material detector.

Fourth Representative Embodiment

Figure 4:
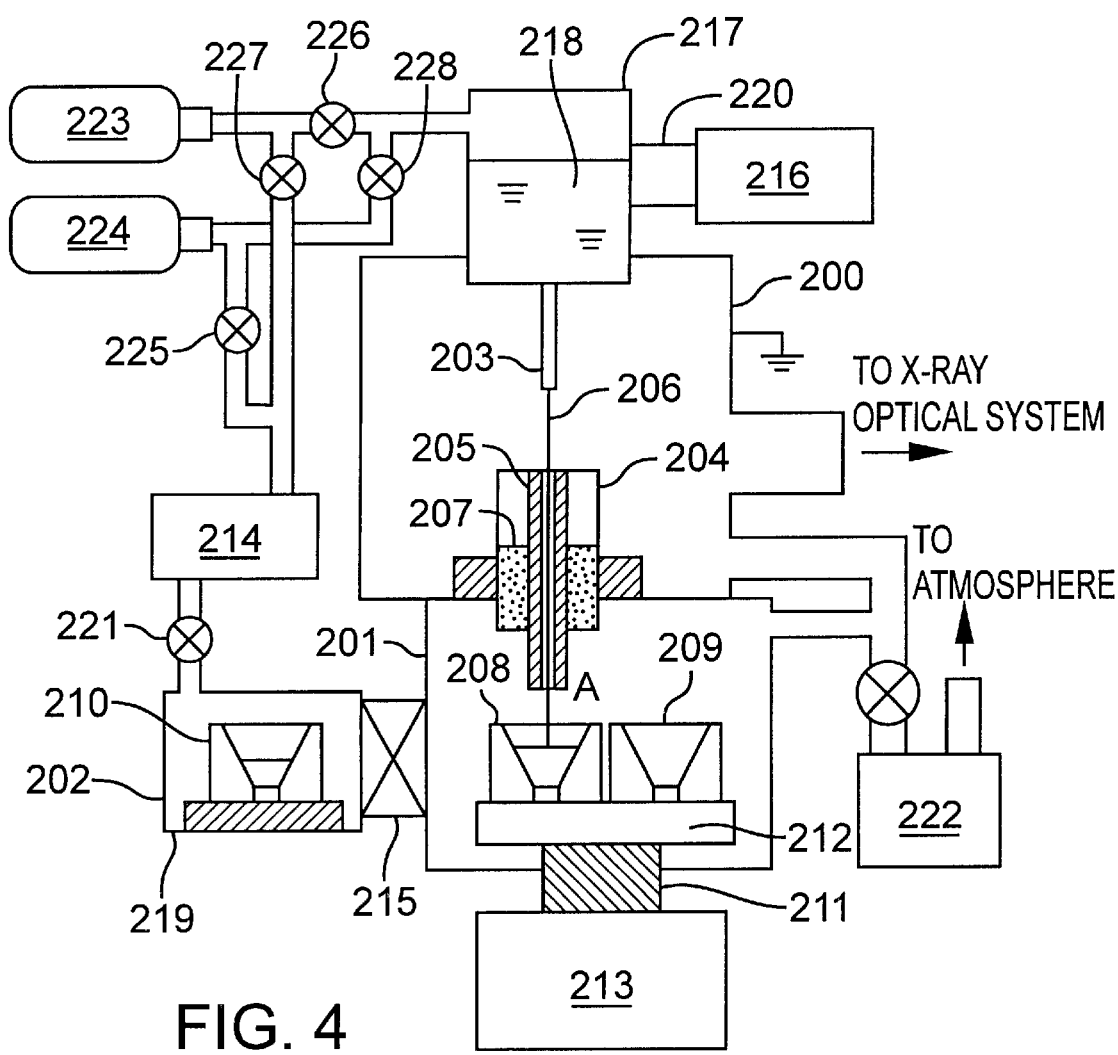
FIG. 4 is a schematic diagram of a fourth representative embodiment of an X-ray source according to the invention.

This embodiment is shown schematically in FIG. 4. This embodiment utilizes the same DPF device as the FIG.-3 embodiment, and uses a liquid target material.

A cathode electrode 204, attached to a vacuum chamber 200, supports an anode electrode 205 via an insulating member 207. Whenever high-voltage pulses are applied between the anode electrode 205 and the cathode electrode 204, a plasma sheath is produced from the surface of the insulating member 207. The plasma sheath rises between the electrodes 204, 205 and is focused at the tip of the anode electrode 205. In the figure, the DPF power supply is not shown for clarity.

As in the FIG.-3 embodiment, this embodiment includes two vacuum chambers 200, 201. The pressure inside the vacuum chambers 200, 201 is reduced by a vacuum pump 222 to a vacuum level (e.g., about 10 Torr or less) at which SXR radiation radiated from the plasma is not absorbed or attenuated significantly.

Unlike the FIG.-3 embodiment, the target material in the FIG.-4 embodiment is not formed as discrete liquid droplets discharged from a nozzle. Rather, the target material is provided as a continuous stream 206 of liquid discharged from a nozzle 203. The respective positions of the nozzle 203 and anode electrode 205 are established so that the stream 206 of target material descends directly from above and toward the anode electrode 205.

In this embodiment liquid xenon (Xe) desirably is used as the target material. During delivery of target material, valves 227, 228 are closed, and valves 225, 226 are opened. Thus, xenon gas from a tank 223 is supplied at a pressure of 20 to 30 atmospheres into a target-material reservoir 217. The target-material reservoir 217 is cooled to about 170 K to 200 K by a thermally conductive body 220 cooled by a cooling bath 216 of liquid nitrogen, thereby liquefying the xenon gas in the reservoir 217. The liquid xenon 218 is stored in the target reservoir 217 for use.

For discharging liquid xenon, the nozzle 203 has an inner diameter of, e.g., 10 $\mu$m. Liquid xenon has a low surface tension, and hence does not form droplets. Rather, the liquid xenon is discharged from the nozzle 203 as a continuous stream 206. The liquid xenon, as a target material, enters the plasma when the plasma sheath generated by the DFP device reaches the liquid stream 206. SXR radiation is emitted from the xenon-containing plasma.

As in the FIG.-3 embodiment, the stream 206 of liquid xenon not made into a plasma passes through the lumen of the anode electrode 205 into a trap 208 in the vacuum chamber 201. Two traps 208, 209 are cooled and supported on a cooling stage 212 that is cooled by a thermally conductive body 211 cooled by liquid nitrogen delivered from a liquid-nitrogen reservoir 213. Thus, liquid xenon entering the trap 208 is solidified immediately.

Whenever the trap 208 becomes filled with solidified xenon, a vacuum is created in an adjacent preliminary chamber 202. A gate valve 215 is opened, and the trap 208 conveyed to the preliminary chamber 202. Meanwhile, a previously cooled trap 209 in the vacuum chamber 201 is moved into position to capture and solidify unused target material passing through the anode electrode 205. Also, an empty trap 210 located in the preliminary chamber 202 is conveyed to the previous position of the trap 209 in the vacuum chamber 201 to begin cooling. After the gate valve 215 closes, the trap 208 now located inside the preliminary chamber 202 is heated by a heater 219 to vaporize the solid xenon and thus empty the trap 208.

Xenon gas released from the trap 208 passes through a valve 221 and is compressed by a compressor 214. The compressed xenon passes through a conduit to a second tank 224 (serving as a recovery tank) for storage. During use of the FIG.-4 apparatus, whenever the xenon gas in a first tank 223 is consumed, the valves 225, 226 close, and the valves 227, 228 open to begin supplying xenon from the second tank 224. Now, the first tank 223 is used as the recovery tank. Long-term operation can be achieved by repeating this scheme of xenon recovery, storage, and delivery.

Because this embodiment utilizes a target material that is a gas (specifically an inert noble gas) at normal temperature, even if the target material should disperse as it generates a plasma, nearby optical components are not contaminated by the target material. Also, in this embodiment, because the target material is supplied as a continuous liquid stream, it is unnecessary to synchronize delivery of particles of target material with application of pulses to the electrodes, thereby simplifying the structure of the apparatus.

Although this embodiment is described in the context of using xenon as the target material, other target materials alternatively can be used. Exemplary alternative target materials include krypton (Kr) or oxygen ($O_2$) gas, oxygen compounds (e.g., $CO_2$), fluorine (F) gas, and fluorine compounds (e.g., $CF_4$, $SF_6$). In a plasma, Xe and Kr generate SXR radiation with respective peaks near 11 nm, and produce continuous SXR spectra within the range of 9 to 15 nm. Also, the SXR spectrum of oxygen exhibits strong lines at 13 nm and 15 nm, and fluorine exhibits a strong line at 14 nm. Hence, these target materials can be suitable for use in an X-ray source according to this embodiment, as used in a microlithography apparatus in which the optical system comprises Mo/Si or Mo/Be multilayer-film mirrors.

The FIG.-4 apparatus is configured such that the plasma generated by the DPF device moves upward and is focused near the upper end of the anode electrode 205, and the liquid stream 206 is made into plasma when the stream passes that location. Alternatively, the portion consisting of the anode electrode 205, cathode electrode 204, and insulating member 207 can be inverted vertically, with the end A in FIG. 4 pointing upward. With such a configuration, the liquid stream 206 (entering the anode electrode 205 from the end A) is made into plasma when it exits the anode electrode 205. Further alternatively, the nozzle 203 can be configured as part of the anode electrode 205.

Fifth Representative Embodiment

Figure 5:
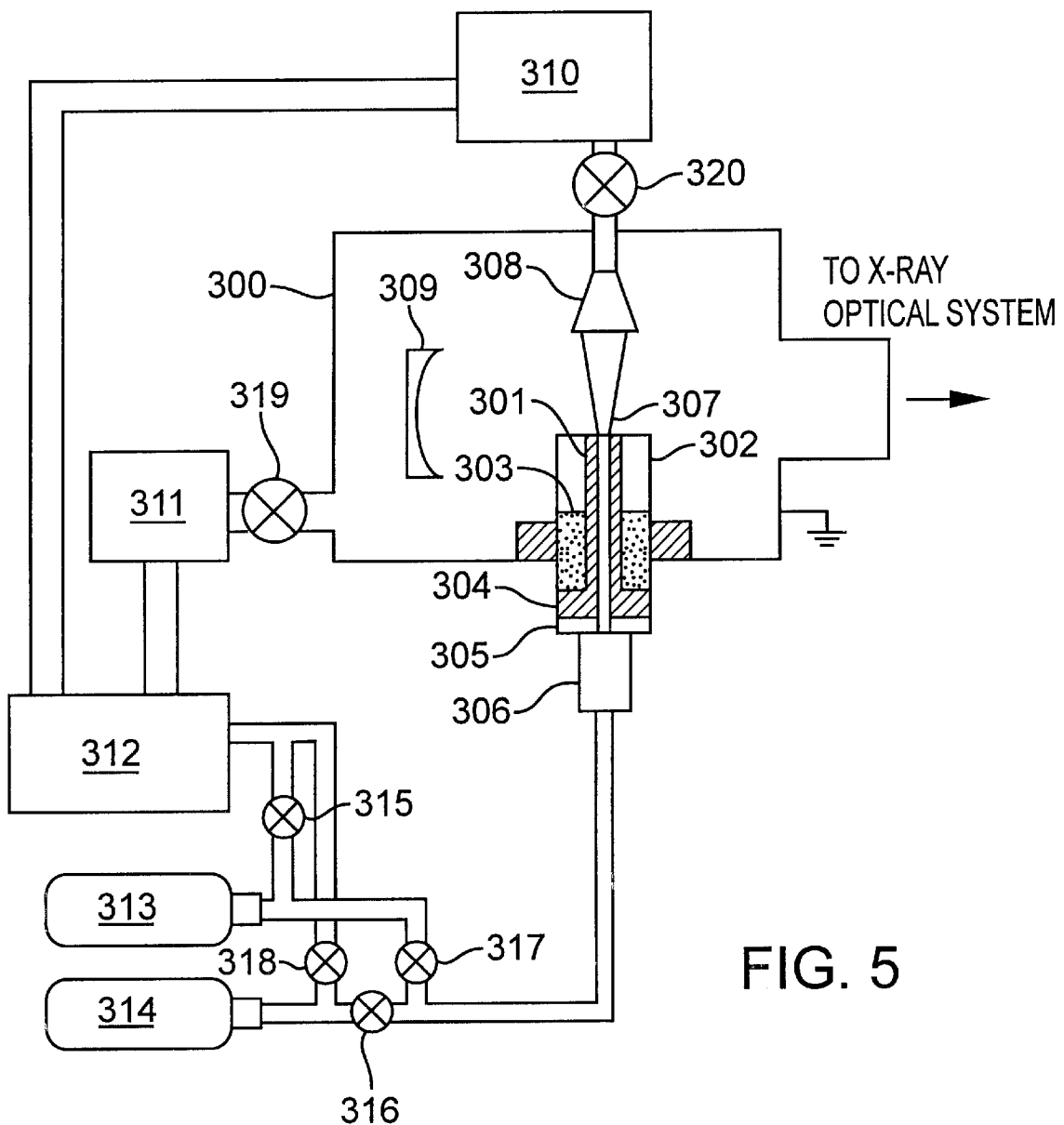
FIG. 5 is a schematic diagram of a fifth representative embodiment of an X-ray source according to the invention.

This embodiment is depicted schematically in FIG. 5. This embodiment also utilizes a DPF-type discharge plasma X-ray source (the DPF power supply is not shown for clarity). In this embodiment the anode electrode 301 functions in a manner similar to an ultrasonic nozzle. The anode electrode 301 desirably is made of molybdenum (Mo). A conductive member 304 is attached to one end of the anode electrode 301 and supplies electrical current to the anode electrode 301. The cathode electrode 302 also is made of molybdenum (Mo) and is grounded electrically via connection to a vacuum chamber 300. The cathode electrode 302 and anode electrode 301 are spaced apart from each other by an insulating member 303.

Whenever a high-voltage pulse is applied between the anode electrode 301 and cathode electrode 302, a plasma sheath is generated from the surface of the insulating member 303. The plasma rises between the electrodes 301, 302 and is focused at the tip of the anode electrode 301.

The anode electrode 301 also is connected to a pulse valve 306 via an insulating plate 305. The pulse valve 306 is connected to Xe gas tanks 313, 314. To supply Xe gas from the tank 314, valves 317, 318 close, and valves 315, 316 open. Under such conditions, the back pressure experienced by the pulse valve 306 is 30 atmospheres. A trigger signal generated by a controller (not shown) is input to a valve driver (not shown) to cause the pulse valve 306 to open for about 1 ms. During the instant that the pulse valve 306 is open, Xe gas is discharged from the tip of the anode electrode 301 (serving as a nozzle). The anode electrode 301 functions essentially as a Laval nozzle from which units of Xe gas are discharged as a supersonic gas stream 307.

Xe gas discharged into the vacuum chamber 300 is cooled by adiabatic expansion. Meanwhile, atoms of Xe gas are attracted to one another (by van der Waals forces) to form "cluster" molecules. Because the Xe gas is discharged as a supersonic gas stream, the cluster molecules of Xe gas experience very little divergence upon exiting the nozzle. Consequently, a suitably high density of Xe is maintained even where the plasma sheath is focused.

A few hundred microseconds after the pulse valve 306 opens, the gas density at the tip of the anode electrode 301 peaks. A trigger signal output from a controller (not shown) and routed to a switching element causes the plasma to be focused at the tip of the anode electrode 301 at the instant of peak density.

Most of the Xe gas discharged from the anode electrode 301 propagates to a gas collector 308 situated opposite the nozzle 301. The collected gas is urged by an exhaust pump 310 through a valve 320. Any remaining gas inside the vacuum chamber 300 is exhausted through a valve 319 by a vacuum pump 311. The exhausted Xe gas is compressed by a compressor 312 and accumulated in a first tank 313. As xenon gas in a second tank 314 is consumed completely, valves 315, 316 close and valves 317, 318 open to begin supplying xenon from the first tank 313 while the second tank 314 is being filled with recovered xenon. This scheme is repeated for long-term operation of the FIG.-5 apparatus.

A multilayer-film mirror 309 (desirably made of Mo/Si) is disposed at a position orthogonal to the direction of gas discharge. Among the SXR radiation radiated from the plasma, only SXR radiation having a wavelength of 13.5 nm (determined by the periodic structure of the Mo/Si layers on the mirror 309) are reflected by the mirror 309 toward a downstream X-ray optical system.

In this embodiment high-density gas is supplied to the location of plasma focus by the anode electrode 301 serving as a supersonic nozzle. This allows stronger X-rays to be generated than otherwise would obtained in the conventional methods involving use of a rarified-atmosphere gas near the electrode. Also, since gas is liberated from the anode electrode at high velocity, any particles created by the discharge are aspirated and routed downstream. Hence, the amount of particulate debris that otherwise would adhere to optical components disposed orthogonal to the gas stream is reduced substantially. In addition, the high-velocity gas stream 307 has a cooling effect on the discharge-heated anode electrode 301.

In this embodiment both the anode electrode 301 and cathode electrode 302 desirably are made of molybdenum (Mo). The transmittance of Mo to electromagnetic radiation having a wavelength of 6 to 14 nm is much higher than the transmittance of tungsten (W) to these wavelengths. Moreover, Mo is one of the elements constituting the multilayer film on the mirror 309. As a result, even if the anode electrode 301 experiences erosion and electrode material becomes deposited on nearby optical components, little reduction in SXR transmittance of the system is experienced, thereby allowing longer continuous operation of the system than obtained with conventional apparatus. In general, a multilayer film is a combination of a substance with a high refractive index and a substance with high-transmittance for reflected X-rays (e.g., Mo). Hence, if the anode electrode 301 and surrounding optical members are made of the same high-transmittance substance as used in the multilayer-film mirror 309, even if debris eroded from the anode electrode 301 adheres to and accumulates on the multilayer-film mirror 309, any decrease in reflectivity of the mirror 309 that otherwise would occur is reduced.

The insulating member 303, situated between the anode electrode 301 and cathode electrode 302, desirably is made of quartz glass ($SiO_2$). Even if the plasma sheath generated above the $SiO_2$ by surface discharge between anode electrode 301 and cathode electrode 302 erodes the $SiO_2$ surface and causes particles of $SiO_2$ to adhere to neighboring optical elements, Si has high transmittance for SXR radiation at wavelengths longer than 12.4 nm (the edge of L absorption). As a result, little attenuation of the reflected wavelength of 13.5 nm occurs. Also, there is little decrease in reflectivity even after long-term operation. $SiO_2$ breaks down essentially into Si and oxygen from exposure to plasma and ultraviolet light and to SXR radiation irradiated from the plasma. The detached oxygen becomes molecular oxygen ($O_2$) or an oxygen compound (e.g., $CO_2$) that is exhausted outside the vacuum chamber 300. As a result, almost no oxygen is deposited on the mirror 309.

The materials used for the electrodes 301, 302, insulating member 303, or other components exposed to the plasma are not limited to those respective materials described above in this embodiment. Alternatively, any of various materials may be selected that has a high transmittance to the wavelength of SXR radiation used. For example, if the wavelength used is roughly in the range of 5 to 10 nm, then any of boron (B), potassium (K), calcium (Ca), chlorides (e.g., vinyl chloride), sulfur (S), phosphorus (P), yttrium (Y), zirconium (Zr), niobium (Nb), Mo, technetium (Tc), ruthenium (Ru), rhodium (Rh), palladium (Pd), silver (Ag), cadmium (Cd), indium (In), tellurium (Te), tin (Sn), antimony (Sb), iodides (e.g., AgI), cesium (Cs), and barium (Ba) can be selected. If the wavelength used is roughly in the range of 10 to 20 $\mu$m, then any of beryllium (Be), P, S, aluminum (Al), Si, K, Ca, rubidium (Rb), strontium (Sr), Y, Zr, Nb, Mo, Tc, Ru, Rh, Cs, Ba, lanthanum (La), cerium (Ce), and samarium (Sm) can be selected. If the wavelength used is roughly in the range of 20 to 40 nm, then any of lithium (Li), K, Ca, magnesium (Mg), Al, S, Cl, Rb, Sr, I, Te, Sb, Ca, Ba, etc. can be selected.

An electrode, insulating member, or other member exposed to plasma can be made of any one of the materials listed above or can be a mixture or compound of any of the listed elements with another substance. However, if these other substances exhibit high absorption at the SXR wavelength(s) used, then the substances need to be exhausted from inside the vacuum chamber 300. Also, the entire anode electrode 301, insulating member 303, or other member exposed to the plasma can be made of any of these materials; or the anode electrode 301, insulating member 303, or other member can have a coating of any of these materials formed on another material (such as stainless steel, tungsten, or the like).

Also, in this embodiment, whereas Xe gas was supplied at room temperature, cooled (e.g., 170 K) Xe gas alternatively can be used. Lowering the temperature of the gas increases the size of the cluster molecules that are created, thereby increasing the target atom density at the plasma focus and increasing the intensity of SXR radiation produced. Also, a lower-temperature gas achieves more effective cooling of the anode electrode 301.

Whereas the target material in this embodiment desirably is gaseous, the target material alternatively can be a suspension of solid particles in a carrier liquid or a suspension of liquid particles in a carrier gas. Either alternative formulation can be discharged from a nozzle in a manner according to the embodiment. By way of example, solid particles of lithium (Li), lithium hydride (LiH), lithium hydroxide (LiOH), lithium fluoride (LiF), tin (Sn), tin oxide ($SnO_2$), $H_2O$ (water ice), dry ice ($CO_2$), organic particles (for example, latex spheres, etc.), copper (Cu), nickel (Ni), aluminum (Al), iron (Fe), ceramic, etc. and liquids such as water ($H_2O$), alcohol, liquefied noble gases (liquefied xenon, liquefied krypton, etc.), liquid nitrogen, etc. can be mixed in a gas and discharged from the anode electrode 301.

As a liquid, suspended in a gas, is discharged from a nozzle in a manner according to this embodiment, the suspension tends to become atomized as it exits the nozzle. When subjected to a plasma, Li emits SXR light with a strong line spectrum at 13.5 nm, and Sn emits SXR light with a strong spectral band centered near 13 nm. Hence, these materials are suitable for producing SXR radiation as used for X-ray microlithography performed using 13-nm SXR radiation. If a gas (with particles suspended therein) is used simply as a carrier gas, then the gas should exhibit low SXR absorption. An example carrier gas is helium (He) which does not absorb generated SXR radiation. On the other hand, if the carrier gas also is used as a target material for SXR generation, then the carrier gas should be a substance that emits SXR radiation at the desired wavelength to be used. For example, if SXR radiation in the wavelength range of 11 to 13 nm is used, then xenon (Xe) or krypton (Kr), which exhibit an SXR spectrum in this range, should be used as the carrier gas.

A Laval nozzle desirably is used as the discharge nozzle (anode electrode 301) in this embodiment. However, the nozzle need not be profiled as a Laval nozzle. Alternative other shapes can be used such as a conical nozzle. Also, whereas this embodiment desirably uses a supersonic flow of target material from the nozzle, a subsonic flow alternatively can be used if sufficient target-material density is ensured at the plasma focus.

Also, whereas in this embodiment the target gas desirably is discharged in a pulsatile manner from the Laval nozzle (anode electrode 301), the discharge of target material alternatively can be continuous. Pulse-valve operation becomes especially difficult if the discharge pulse rate is faster than a few kHz. Under such conditions, continuous discharge is appropriate. Also, with continuous discharge, it is not necessary to synchronize nozzle operation with the discharge, thereby simplifying the configuration of the device.

Sixth Representative Embodiment

Figure 6:
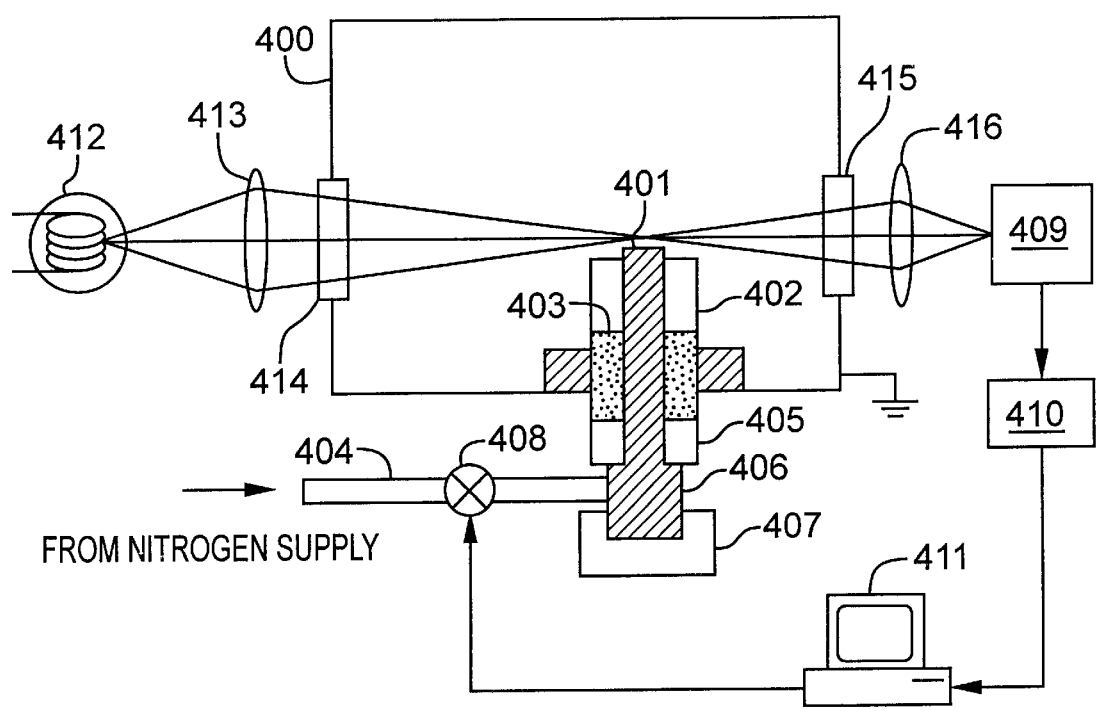
FIG. 6 is a schematic diagram of a sixth representative embodiment of an X-ray source according to the invention.

This embodiment is shown schematically in FIG. 6. This embodiment, similar to the embodiments shown in FIGS. 3–5, uses a DPF device (the DPF power supply is not shown in FIG. 6 for clarity). However, this embodiment differs from the embodiments of FIGS. 3–5 in that the anode electrode itself is used as a target (i.e., as a source of target material).

A cathode electrode 402 is attached to a vacuum chamber 400 and supports an anode electrode 401 (desirably made of lithium) via an insulating member 403. Whenever high-voltage pulses are applied between the anode electrode 401 and cathode electrode 402, a plasma sheath is produced from the surface of the insulating member 403. The plasma sheath rises between the electrodes, and is focused at the tip of the anode electrode 401. An SXR-producing plasma is formed at the tip of the anode electrode 401.

In this embodiment a mechanism is provided to adjust the length of the anode electrode as required to replenish the anode electrode as the anode electrode is gradually eroded away from use. The mechanism comprises a furnace 406 situated beneath the anode electrode 401. The furnace 406 provides a source of molten lithium used to add to the mass (and thus the length) of the anode electrode 401 from the bottom.

The position of the upstream tip of the anode electrode 401 is monitored constantly or periodically, such as by a CCD camera 409. Illumination light is provided by an illumination-light source 412. The illumination light passes through a lens 413 and a window 414 to the tip of the anode electrode 401. From the anode electrode 401 the light passes through a second window 415 and a second lens 416 that forms an image of the tip on the CCD camera 409. The image obtained by the CCD camera 409 is stored in a frame memory 410 and processed by a computer 411.

First, an image of the anode electrode 401 is obtained in advance, before starting operation of the X-ray source. Fresh images of the anode electrode 401 are obtained and input to the computer 411 constantly or periodically during operation of the X-ray source and compared to the stored image of the anode electrode 401 obtained before starting operation. From image comparisons performed by the computer 411, if the tip position of the anode electrode 401 exceeds an allowed positional range, current is supplied to a heater 407 attached to the furnace 406 to melt the lithium in the furnace 406. The melting point of lithium is 179 C at atmospheric pressure. After the lithium is melted, a valve 408 opens and nitrogen gas is introduced inside the furnace 406 from a conduit pipe 404. The resulting pressure in the furnace pushes the melted lithium toward the anode electrode 401 (upward in FIG. 6). Hence, the anode electrode is replenished by extrusion from beneath. An appropriately configured extrusion die 405 shapes the lithium as the lithium is extruded through the die 405.

To facilitate solidification of lithium during extrusion, the extrusion die 405 is cooled during operation, desirably by circulating cooling water (not shown). Replenishment of the anode electrode 401 in this manner is monitored by the CCD camera 409. Whenever the CCD camera 409 detects that the tip of the anode electrode 401 has reached, by replenishment of the anode electrode from below, a specified position, the valve 408 closes to stop further extrusion of lithium and thus stop further growth of the anode electrode 401.

By continuously or intermittently replenishing the anode electrode 401 in this manner, the need to stop operation of the X-ray source to adjust or replace the anode electrode 401 is eliminated, thereby providing improved operational efficiency compared to conventional apparatus. Also, because the tip position of the anode electrode 401 is maintained substantially at the same position during use, the plasma-creating discharge therefrom is stable, which produces a stable intensity of SXR radiation. Also, fluctuations in the X-ray-generation position are reduced.

In this embodiment illumination of the anode electrode 401 desirably is by critical illumination. Alternatively, illumination can be by Koehler illumination.

Also, in this embodiment, the position of the tip of the anode electrode desirably is determined and controlled by direct observation of an image of the anode electrode. However, this embodiment is not limited to such a scheme. The tip position of the anode electrode 401 also can be measured and controlled using a contact-needle sensor or non-contacting sensor (e.g., a laser displacement sensor). Direct observation is desired for simplicity.

In this embodiment lithium desirably is used as the anode-electrode 401 material. However, it will be understood that the anode electrode 401 alternatively can be made of any material suitable for generating SXR radiation of the specified wavelength and that can be formed into an anode electrode under actual-use conditions. Also, whereas in this embodiment an electrode-"movement" mechanism is provided only for the anode electrode 401, such a mechanism alternatively can be provided for the cathode electrode 402, or for both electrodes 401, 402.

Seventh Representative Embodiment

Figure 7:
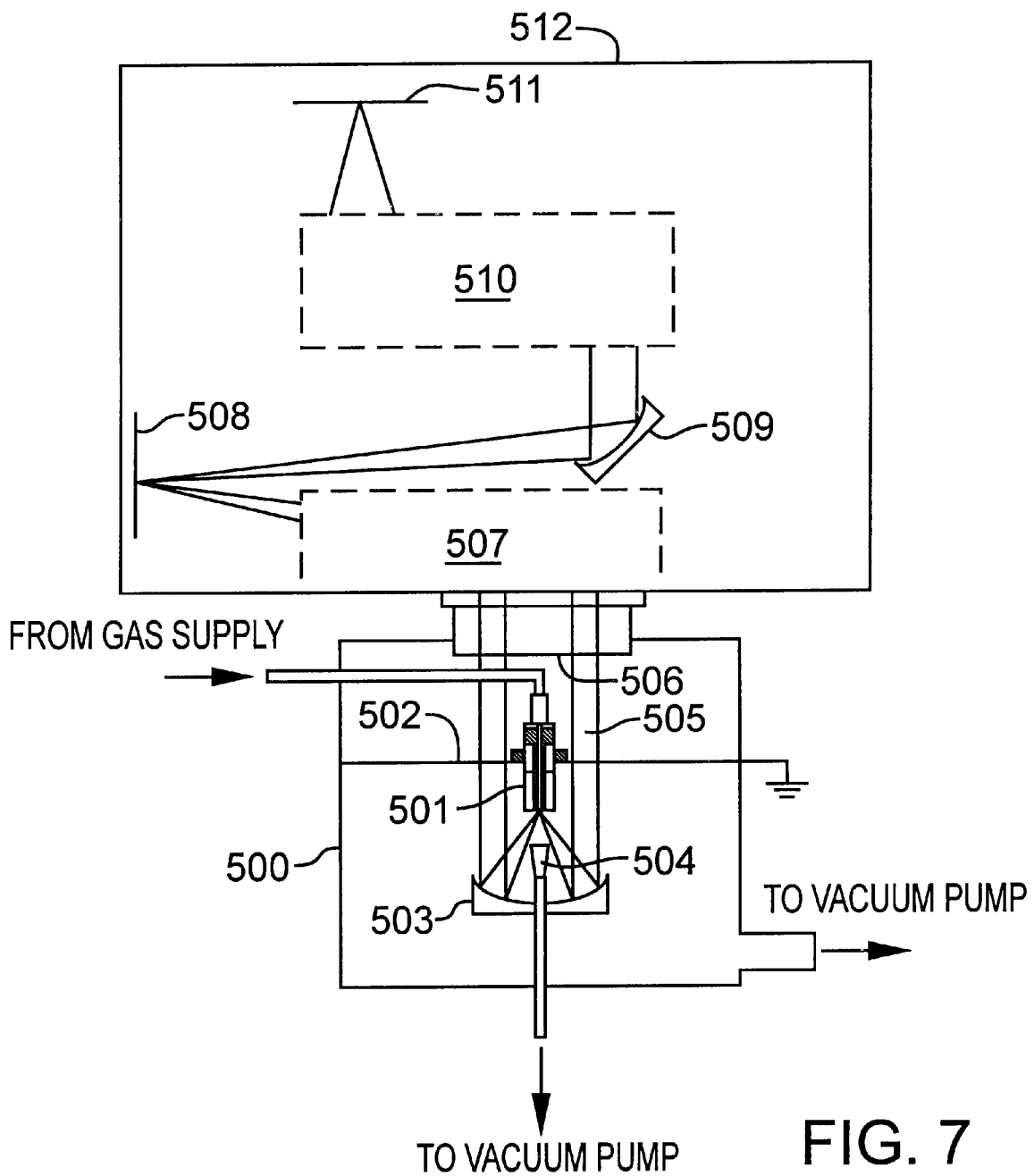
FIG. 7 is a schematic diagram of a representative embodiment of an X-ray microlithography apparatus according to the invention, wherein the apparatus includes an X-ray source as described in the fifth representative embodiment.

An X-ray microlithography apparatus according to this embodiment is depicted schematically in FIG. 7. By way of example, this embodiment comprises an X-ray source similar to that shown in FIG. 5. In FIG. 7, details of the power supply that applies high-voltage pulses to the discharge-plasma X-ray source and of the discharge-plasma X-ray source itself are not shown for clarity. Also not shown are devices for gas recovery and circulation.

As described and shown in the FIG.-5 embodiment, an anode electrode configured as a supersonic nozzle is made of molybdenum (Mo). The anode electrode is attached to a cathode electrode and a pulse valve via an insulating plate. This assembly constitutes a DPF electrode assembly 501. The cathode electrode is secured to a vacuum chamber 500 by a support column 502.

The pulse valve is connected to a supply (e.g., tank, not shown) of xenon via a conduit and feedthrough (through the wall of the vacuum chamber 500). The back pressure experienced by the pulse valve is 30 atmospheres. A flue-shaped collector 504 is situated and configured for gas recovery. The collector 504 is attached at a position opposite the anode electrode. Hence, xenon gas discharged from the anode electrode is exhausted efficiently to outside the vacuum chamber 500. In addition, the interior of the vacuum chamber 500 is evacuated by a vacuum pump (not shown). Gas removed from the vacuum chamber 500 in this manner is compressed by passage through a compressor, recovered, and reused, as described above.

A trigger signal produced by and output from a controller is routed to the pulse valve and a switching element so that plasma is focused at the tip of the anode electrode whenever the density of target gas at the tip is at a maximum.

Surrounding the gas-recovery collector 504 is a mirror 503 defining a reflective surface configured as a paraboloid of revolution. The reflective surface of the mirror 503 is coated with a Mo/Si multilayer film. The periodic length of the Mo/Si multilayer film is established so that the wavelength of SXR radiation reflected from the multilayer-film surface is 13.5 nm. I.e., SXR radiation radiated from the discharge plasma are incident upon the reflective surface of the mirror 503, and only SXR radiation 505 having a wavelength of 13.5 nm are reflected. The SXR radiation passes through a filter 506 (made of zirconium (Zr) 0.15 nm thick) that blocks visible light and transmits SXR radiation. The transmitted SXR radiation is directed as an illumination beam to an illumination-optical system 507 in the vacuum chamber 512.

The illumination-optical system 507 shapes the illumination beam to illuminate an arc-shaped region on a reflecting reticle 508. The reflecting reticle 508 defines a pattern for, e.g., a layer of an integrated circuit or other microelectronic device. SXR radiation reflected from the reticle 508 is directed by a mirror 509 to a projection-optical system 510. The projection-optical system 510 demagnifies the image of the illuminated region of the reticle 508 and focuses the image on a suitable substrate 511 (e.g., silicon wafer) coated with a suitable resist. During exposure, the substrate 511 and reticle 508 are mounted on respective movable stages (not shown but well understood in the art). The stages normally are moved synchronously in a scanning manner. Thus, the entire surface of an IC chip 25 mm on a side readily can be scanned. By way of example, at the exposure wavelength used in this embodiment, a 0.07-$\mu$m LSI IC pattern can be exposed on the resist.

Each of the above-described embodiments of an X-ray source according to the invention utilizes a Dense Plasma Focus (DPF) as the discharge-plasma X-ray source. However, discharge-plasma X-ray sources according to the invention are not limited to DPF. Any configuration of discharge-plasma X-ray source alternatively can be used so long as a plasma is produced and SXR radiation is generated by discharge between electrodes.

Eighth Representative Embodiment

Figure 8:
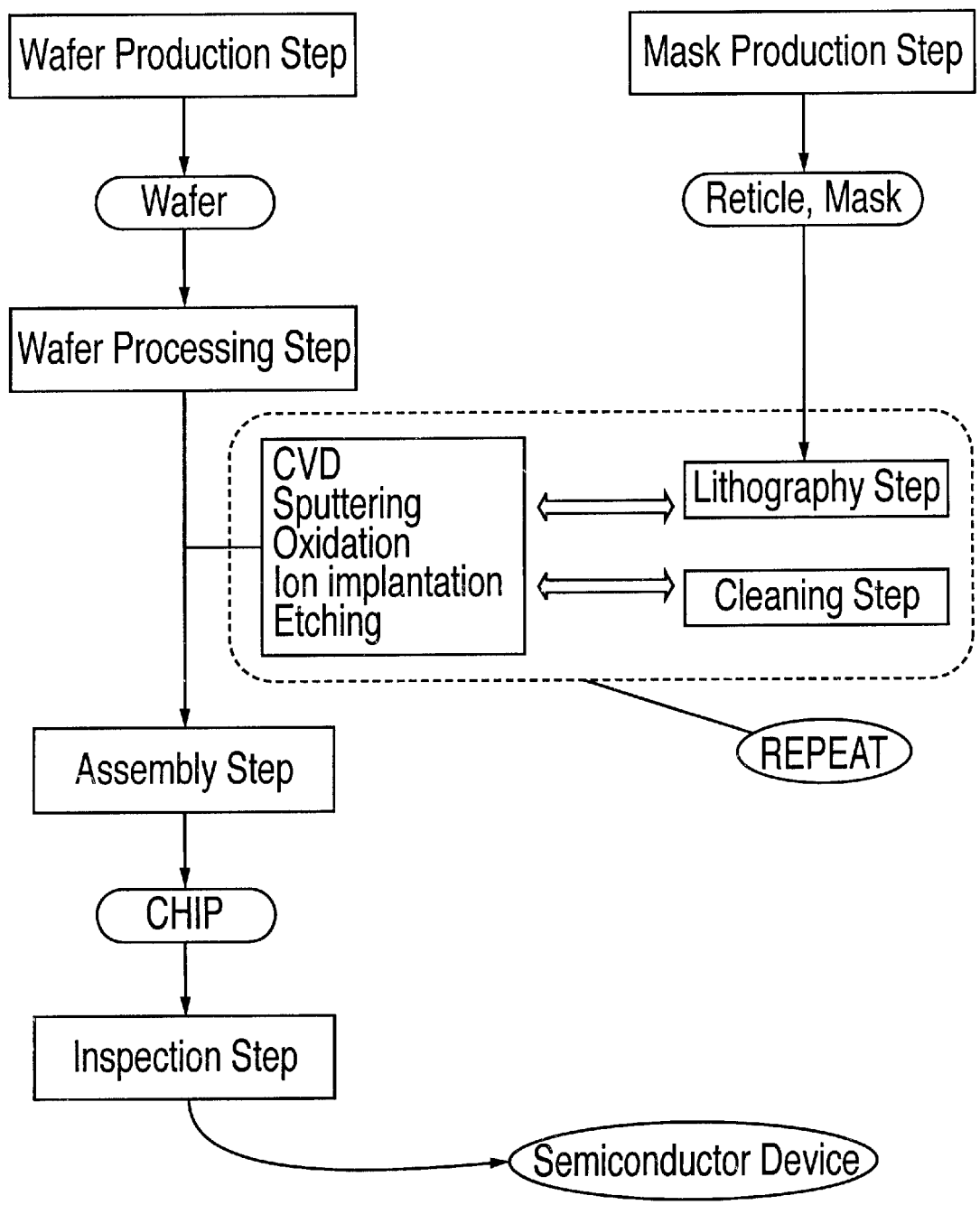
FIG. 8 is a process flowchart for manufacturing a microelectronic device, wherein the process includes a microlithography method according to the invention.

FIG. 8 is a flowchart of an exemplary microelectronic-fabrication method to which apparatus and methods according to the invention readily can be applied. The fabrication method generally comprises the main steps of wafer production (wafer preparation); reticle production (reticle preparation); wafer processing; device assembly, dicing, and making the devices operational; and device inspection. Each step usually comprises several sub-steps.

Among these main steps, wafer processing is key to achieving the smallest feature sizes (critical dimensions), best inter-layer registration, and performance of the microelectronic devices. In the wafer processing step, multiple circuit patterns are layered successively atop one another on the wafer, wherein the formation of each layer typically involves multiple sub-steps. Usually, many operative microelectronic devices (e.g., microprocessor chips or memory chips) are produced on each wafer.

Typical wafer-processing steps include: (1) thin-film formation (by, e.g., CVD or sputtering) involving formation of a dielectric layer for electrical insulation or a metal layer for connecting wires; (2) oxidation to oxidize the thin film or the surface of the wafer itself; (3) microlithography to form a resist pattern (as defined by a reticle) on the wafer for selective processing of the thin film or the substrate itself; (4) etching (e.g., dry etching) or analogous step to etch the thin film or wafer according to the resist pattern; (5) doping or impurity implantation to implant ions or impurities into the thin film or wafer; (6) resist stripping to remove the resist from the wafer; and (7) chip inspection. Wafer processing is repeated as required (typically many times) to fabricate the desired microelectronic devices on the wafer.

Figure 9:
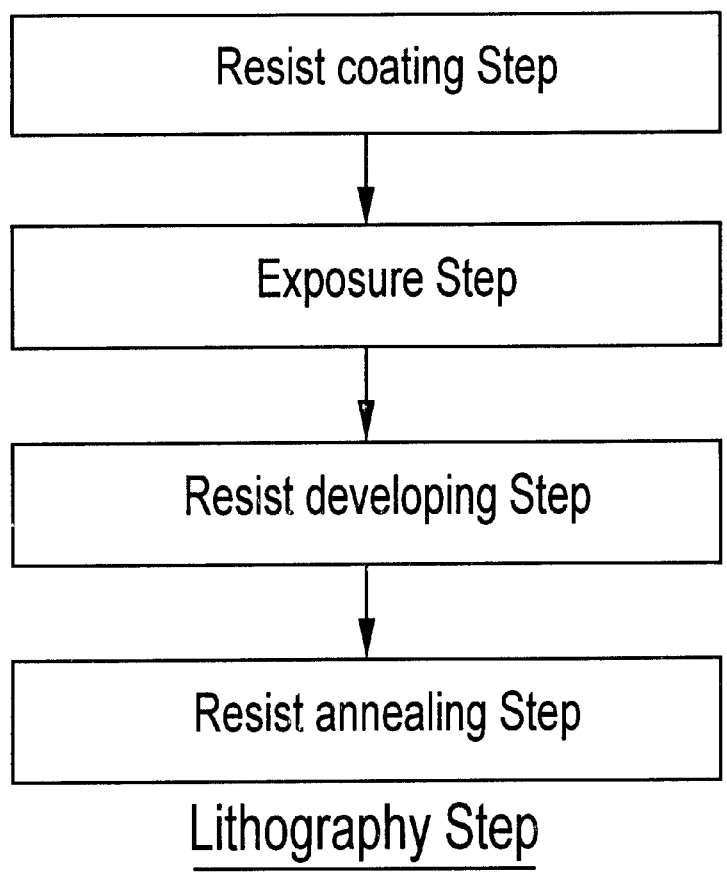
FIG. 9 is a process flowchart for performing a microlithography method performed using a microlithography apparatus according to the invention.

FIG. 9 provides a flowchart of typical steps performed in microlithography, which is a principal step in wafer processing. The microlithography step typically includes: (1) a resist-coating step, wherein a suitable resist is coated on the wafer surface (which can include a circuit pattern formed in a previous wafer-processing step); (2) an exposure step, to expose the resist with the desired pattern and form a latent image of the pattern in the resist; (3) a development step, to develop the latent image in the exposed resist; and (4) an optional annealing step, to enhance the durability of the developed resist pattern.

These wafer-production steps, reticle-production steps, wafer-processing steps, and microlithography steps are well known. Hence, additional description of these steps is unnecessary.

The microlithography step noted above is the principal step in which a pattern with a small linewidth can be exposed and transferred to a substrate using an X-ray-exposure device according to the invention. Such an X-ray-exposure device can be operated continuously over a long period, allowing fabrication of microelectronic devices with good throughput.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. An X-ray-generation device, comprising:
   first and second electrodes configured and situated relative to each other such that a voltage pulse applied across the electrodes forms a first plasma between the electrodes and concentrates the first plasma at a location relative to the first electrode;
   the location including a target material that is energized by the concentrated first plasma sufficiently to be consumed and to cause a second concentrated plasma of the target material to emit soft X-ray radiation having a spectral profile characteristic of the target material; and
   means for supplying, during operation of the X-ray-generation device, the target material to the location as the target material is consumed by the concentrated plasma.

2. The device of claim 1, wherein said means for supplying the target material provides the target material continuously as the target material is consumed.

3. The device of claim 1, wherein said means for supplying the target material provides the target material intermittently as the target material is consumed.

4. The device of claim 1, wherein:
   the target material is a gas; and
   said means for supplying the target material comprises a gas vessel and a valve, the valve being situated and configured to controllably release gas from the gas vessel to the location.

5. The device of claim 4, wherein:
   the first electrode is hollow and having a first end connected to the valve, a second end opening at the location, and a lumen connecting the first and second ends; and
   the valve is situated and configured to controllably release gas from the gas vessel through the lumen and the second end of the hollow electrode to the location.

6. The device of claim 5, further comprising means for recovering unconsumed target-material gas for subsequent recycling to said means for supplying the target material.

7. The device of claim 1, wherein:
   the target material is a liquid; and
   said means for supplying the target material comprises a reservoir and a nozzle, the nozzle being situated and configured to controllably discharge the target material from the reservoir to the location.

8. The device of claim 7, wherein the nozzle is configured to discharge the target material as a continuous liquid stream to the location.

9. The device of claim 7, wherein the nozzle is configured to discharge the target material as discrete droplets to the location.

10. The device of claim 7, further comprising means for recovering unconsumed target material for subsequent recycling to said means for supplying the target material.

11. The device of claim 10, wherein:
    the first electrode is hollow and has a first end opening at the location, a second end, and a lumen connecting the first and second ends;
    said means for supplying the target material is configured to direct the target material to the first end such that unconsumed target material enters the first end and passes through the lumen to the second end; and
    said means for recovering unconsumed target material comprises a trap situated and configured to collect unconsumed target material exiting the second end.

12. The device of claim 11, wherein said means for recovering unconsumed target material further comprises means for recycling collected unconsumed target material from the trap to the reservoir.

13. The device of claim 1, wherein the target material is a solid.

14. The device of claim 13, wherein said means for supplying the target material comprises a reservoir and a nozzle, the nozzle being situated and configured to controllably discharge particles of the target material from the reservoir to the location.

15. The device of claim 14, wherein:
    the first electrode is hollow and having a first end opening at the location, a second end, and a lumen connecting the first and second ends;
    said means for supplying the target material is configured to direct the target material to the first end such that unconsumed target material enters the first end and passes through the lumen to the second end; and
    said means for recovering unconsumed target material comprises a trap situated and configured to collect unconsumed target material exiting the second end.

16. The device of claim 15, wherein said means for recovering unconsumed target material further comprises means for recycling collected unconsumed target material from the trap to the reservoir.

17. The device of claim 13, wherein:
    the first electrode is made at least partially of the target material that is consumed in the concentrated plasma at the location, thus eroding the electrode; and
    said means for supplying the target material comprises a mechanism situated and configured to replenish the first electrode during erosion of the first electrode.

18. The device of claim 17, wherein the mechanism comprises a linear actuator attached to the first electrode, the linear actuator being configured to move the first electrode in a manner serving to compensate for erosion of the first electrode.

19. The device of claim 17, wherein:
    the first electrode is made of the solid target material and has a proximal end adjacent the location, and a distal end; and
    the mechanism comprises an extruder having an output connected to the distal end, the extruder being configured to extrude an additional length of the first electrode to compensate for erosion of the first electrode.

20. The device of claim 19, wherein the extruder comprises a furnace providing a source of liquid target material, an extrusion die, and means for urging the liquid target material through the extrusion die such that the extruded liquid solidifies at the distal end in a manner serving to increase a length of the first electrode sufficiently to restore the proximal end adjacent the location.

21. The device of claim 17, further comprising a first-electrode monitor situated and configured to detect a position of the first electrode during use so as to detect a need for replenishing the first electrode and to direct the mechanism to replenish the first electrode as required to compensate for erosion of the first electrode.

22. An X-ray-generation device, comprising:
    first and second electrodes configured and situated relative to each other such that a voltage pulse applied across the electrodes forms a plasma between the electrodes and concentrates the plasma at a location adjacent the first electrode;
    means for providing a target material at the location so as to cause the concentrated plasma to produce soft-X-ray radiation having a spectral profile characteristic of the target material; and means for replenishing, during operation of the X-ray-generation device, the first electrode as the first electrode is eroded during operation of the X-ray-generation device.

23. The apparatus of claim 22, wherein said means for replenishing the first electrode is performed either intermittently or continuously.

24. The apparatus of claim 22, wherein:

the first electrode comprises a tip situated adjacent the location; and the apparatus further comprises means for controllably maintaining the tip at a substantially constant position as the tip is eroded during operation of the X-ray-generation device.

25. An X-ray-generation device, comprising:

first and second electrodes configured and situated relative to each other such that a voltage pulse applied across the electrodes forms a plasma between the electrodes and concentrates the plasma at a location adjacent the first electrode;

means for providing a target material at the location so as to cause the concentrated plasma to produce soft-X-ray radiation having a spectral profile characteristic of the target material; and means for continuously or intermittently supplying the target material during operation of the X-ray-generation device.

26. The device of claim 25, wherein the target material is a gas.

27. The device of claim 25, wherein the target material is a liquid.

28. The device of claim 25, wherein the target material is a solid.

29. The device of claim 25, further comprising a trigger mechanism connected to the electrodes and configured to control a timing with which the voltage pulses are applied to the electrodes so that a plasma is produced at the location or a plasma previously generated between the electrodes arrives at the location synchronously with provision of the target material at the location or with a moment in which a density of the target material at the location exceeds a predetermined threshold density.

30. An X-ray-generation device, comprising:

first and second electrodes configured and situated relative to each other such that a voltage pulse applied across the electrodes forms a plasma between the electrodes and concentrates the plasma at a location adjacent the first electrode; and a target-material supply mechanism configured to introduce, during operation of the device, the target material as a supersonic gas stream at the location so as to cause the concentrated plasma to produce soft-X-ray radiation having a spectral profile characteristic of the target material.

31. An X-ray-generation device, comprising:

first and second electrodes configured and situated relative to each other such that a voltage pulse applied across the electrodes forms a plasma between the electrodes and concentrates the plasma at a location adjacent the first electrode; and a target-material supply mechanism configured to suspend particles of a target material in a carrier gas and to discharge the suspension at the location during operation of the device.

32. An X-ray-generation device, comprising:

first and second electrodes configured and situated relative to each other such that a voltage pulse applied across the electrodes forms a plasma between the electrodes and concentrates the plasma at a location adjacent the first electrode; and a target-material supply mechanism configured to deliver, during operation of the device, a focused stream of a target material at the location, the stream being of discrete liquid droplets of target material, discrete particles of the target material, a continuous liquid stream of target material, or a continuous gaseous stream of target material.

33. An X-ray-generation device, comprising:

first and second electrodes configured and situated relative to each other such that a voltage pulse applied across the electrodes forms a plasma between the electrodes and concentrates the plasma at a location adjacent the first electrode; and a target-material supply mechanism configured to deliver, during operation of the device, a target material from at least one of the electrodes to the location.

34. An X-ray-generation device, comprising:

first and second electrodes configured and situated relative to each other such that a voltage pulse applied across the electrodes forms a plasma between the electrodes and concentrates the plasma at a location adjacent the first electrode; and a target-material supply mechanism configured to deliver, during operation of the device, lithium hydroxide to the location, the lithium hydroxide being formulated as discrete solid particles, a suspension, a solution, or a gas.

35. An X-ray-generation device, comprising:

an anode electrode, an insulating member, and a cathode electrode configured and situated relative to each other such that a voltage pulse applied across the electrodes forms a plasma between the electrodes and concentrates the plasma at a location adjacent one of the electrodes; and a target-material supply mechanism configured to deliver, during operation of the device, a target material to the location so as to cause the concentrated plasma to produce soft-X-ray radiation having a spectral profile characteristic of the target material; and at least one of the electrodes, the insulating member, or other component exposed to the plasma being made of a material that is transmissive to the soft X-ray radiation.

36. A soft-X-ray (SXR) source, comprising:

a dense plasma focus (DPF) device configured to produce a plasma; and a target-material-supply mechanism configured to continuously or intermittently supply, during operation of the dense plasma focus device, a target material to the plasma to cause the plasma to produce soft-X-ray radiation having a spectral profile characteristic of the target material.

37. The SXR source of claim 35, wherein:

the DPF device comprises multiple electrodes; and the target-material-supply mechanism comprises a mechanism configured to replenish, during operation of the source, an electrode as the electrode is eroded during operation.

38. An X-ray microlithography apparatus for transferring a pattern, defined on a reticle, to a substrate coated with a resist, the apparatus comprising an X-ray-generation device as recited in claim 1.

39. An X-ray microlithography apparatus for transferring a pattern, defined on a reticle, to a substrate coated with a resist, the apparatus comprising an X-ray-generation device as recited in claim 22.

40. An X-ray microlithography apparatus for transferring a pattern, defined on a reticle, to a substrate coated with a resist, the apparatus comprising an SXR source as recited in claim 36.

41. A process for manufacturing a microelectronic device, comprising the steps of:

(a) preparing a wafer;

(b) processing the wafer; and (c) assembling devices formed on the wafer during steps (a) and (b), wherein step (b) comprises the steps of (i) applying a resist to the wafer; (ii) exposing the resist; (iii) and developing the resist; and step (ii) comprises providing an X-ray microlithography apparatus as recited in claim 38; and using the X-ray microlithography apparatus to expose the resist with the pattern defined on the reticle.

42. A process for manufacturing a microelectronic device, comprising the steps of:

(a) preparing a wafer;

(b) processing the wafer; and (c) assembling devices formed on the wafer during steps (a) and (b), wherein step (b) comprises the steps of (i) applying a resist to the wafer; (ii) exposing the resist; (iii) and developing the resist; and step (ii) comprises providing an X-ray microlithography apparatus as recited in claim 39; and using the X-ray microlithography apparatus to expose the resist with the pattern defined on the reticle.

43. A process for manufacturing a microelectronic device, comprising the steps of:

(a) preparing a wafer;

(b) processing the wafer; and (c) assembling devices formed on the wafer during steps (a) and (b), wherein step (b) comprises the steps of (i) applying a resist to the wafer; (ii) exposing the resist; (iii) and developing the resist; and step (ii) comprises providing an X-ray microlithography apparatus as recited in claim 40; and using the X-ray microlithography apparatus to expose the resist with the pattern defined on the reticle.

44. In a method for producing a flux of soft X-ray (SXR) radiation using a dense plasma focus (DPF) device, an improvement comprising, while operating the DPF device to produce a plasma, continuously or intermittently supplying a target material to the plasma to cause the plasma to produce soft-X-ray radiation having a spectral profile characteristic of the target material.

45. The method of claim 44, further comprising the step of replenishing, during operation of the DPF device, an electrode of the DPF device as the electrode is eroded during operation.

* * * * *

UNITED STATES PATENT AND TRADEMARK OFFICE
CERTIFICATE OF CORRECTION

PATENT NO. : 6,507,641 B1
DATED : January 14, 2003
INVENTOR(S) : Kondo et al.

It is certified that error appears in the above-identified patent and that said Letters Patent is hereby corrected as shown below:

Column 5,
Line 40, "to held" should be -- to be held --.

Column 16,
Line 28, "$\mu$m," should be -- nm, --.

Signed and Sealed this

Fourth Day of November, 2003

JAMES E. ROGAN
*Director of the United States Patent and Trademark Office*